United States Patent
Komatsuda

(10) Patent No.: US 7,471,456 B2
(45) Date of Patent: Dec. 30, 2008

(54) OPTICAL INTEGRATOR, ILLUMINATION OPTICAL DEVICE, EXPOSURE DEVICE, AND EXPOSURE METHOD

(75) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/647,252

(22) Filed: Dec. 29, 2006

(65) Prior Publication Data

US 2007/0132977 A1 Jun. 14, 2007

Related U.S. Application Data

(63) Continuation of application No. PCT/JP06/301112, filed on Jan. 25, 2006.

(60) Provisional application No. 60/754,676, filed on Dec. 30, 2005.

(30) Foreign Application Priority Data

Feb. 3, 2005 (JP) .............................. 2005-027528

(51) Int. Cl.
G02B 27/10 (2006.01)
G02B 3/02 (2006.01)

(52) U.S. Cl. ..................................... 359/627; 359/720

(58) Field of Classification Search ................. 359/627, 359/720, 763; 355/52, 53, 55, 67–71; 250/548
See application file for complete search history.

(56) References Cited

U.S. PATENT DOCUMENTS

| | | | |
|---|---|---|---|
| 6,285,855 B1 * | 9/2001 | Tsuji ........................... | 359/618 |
| 6,452,661 B1 | 9/2002 | Komatsuda ................... | 355/67 |
| 6,563,567 B1 * | 5/2003 | Komatsuda et al. ........... | 355/71 |
| 6,717,651 B2 * | 4/2004 | Kato et al. ..................... | 355/55 |
| 2003/0031017 A1 | 2/2003 | Tsuji ............................ | 362/268 |
| 2004/0125459 A1 * | 7/2004 | Tanitsu et al. ................ | 359/619 |
| 2005/0213069 A1 | 9/2005 | Murakami .................... | 355/67 |

FOREIGN PATENT DOCUMENTS

| | | |
|---|---|---|
| JP | A 11-312638 | 11/1999 |
| JP | A 2003-045774 | 2/2003 |
| JP | A 2003-045784 | 2/2003 |
| WO | WO 2004/038773 A1 | 5/2004 |

* cited by examiner

*Primary Examiner*—Mohammed Hasan
(74) *Attorney, Agent, or Firm*—Oliff & Berridge, PLC

(57) ABSTRACT

An optical integrator of a wavefront dividing type permits an arbitrary distance to be set between an entrance surface and an exit surface, without production of aberration and without reduction in reflectance on reflecting films. The optical integrator has a plurality of first focusing elements (first concave reflector elements 18a) arranged in parallel, a plurality of second focusing elements (second concave reflector elements 20a) arranged in parallel so as to correspond to the first focusing elements, and a relay optical system (19) disposed in an optical path between the first focusing elements and the second focusing elements. The relay optical system refocuses a light beam focused via one of the first focusing elements, on or near a corresponding second focusing element so as to establish an imaging relation of one-to-one correspondence between one of the first focusing elements and one of the second focusing elements.

48 Claims, 15 Drawing Sheets

(a)

(b)

(a)

(b)

(a)

(b)

(a)

(b)

OPTICAL INTEGRATOR, ILLUMINATION OPTICAL DEVICE, EXPOSURE DEVICE, AND EXPOSURE METHOD

This is a Continuation of a PCT Application No. PCT/JP2006/301112 filed on Jan. 25, 2006, claiming the priorities of a provisional application No. 60/754,676 filed on Dec. 30, 2005 and Japanese Patent Application No. 2005-027528 filed on Feb. 3, 2005 and incorporated by reference in their entirety.

TECHNICAL FIELD

The present invention relates to an optical integrator, illumination optical apparatus, exposure apparatus, and exposure method. More particularly, the present invention relates to an illumination optical apparatus in an exposure apparatus used for fabricating micro devices such as semiconductor devices, image pickup devices, liquid-crystal display devices, and thin-film magnetic heads by lithography.

BACKGROUND ART

The conventional exposure apparatus used in fabrication of semiconductor devices and others is arranged to project a circuit pattern formed on a mask (reticle), through a projection optical system onto a photosensitive substrate (e.g., a wafer) to transfer the circuit pattern onto the photosensitive substrate. The photosensitive substrate is coated with a resist, and the projection exposure through the projection optical system results in exposing the resist to light and obtaining a resist pattern corresponding to the mask pattern. Here the resolving power W of exposure apparatus is dependent upon the wavelength λ of exposure light and the numerical aperture NA of the projection optical system and is expressed by Eq (a) below.

$$W = k \cdot \lambda / NA \quad (k: \text{constant}) \tag{a}$$

In order to enhance the resolving power of exposure apparatus, it is thus necessary to decrease the wavelength λ of exposure light and to increase the numerical aperture NA of the projection optical system. In general, it is difficult to increase the numerical aperture NA of the projection optical system over a predetermined value in terms of optical design, and therefore it becomes necessary to further decrease the wavelength of exposure light. Techniques of EUVL (Extreme UltraViolet Lithography) are thus drawing attention as a next-generation exposure method (exposure apparatus) for semiconductor patterning.

The EUVL exposure apparatus uses EUV (Extreme Ultra-Violet) light in the wavelength range of approximately 5-20 nm, in comparison with the conventional exposure methods using KrF excimer laser light at the wavelength of 248 nm and ArF excimer laser light at the wavelength of 193 nm. When the EUV light is used as exposure light, there is no optically transparent material available. For this reason, the EUVL exposure apparatus necessarily uses a reflective optical integrator, a reflective mask, and a reflective projection optical system (e.g., cf. Patent Document 1).

Patent Document 1: Japanese Patent Application Laid-Open No. 11-312638

DISCLOSURE OF THE INVENTION

Problem To Be Solved By The Invention

The conventional reflective optical integrator disclosed in Patent Document 1 is comprised, as shown in FIG. 15, of a first reflecting element group 111 consisting of a plurality of concave reflector elements 101 arranged in parallel, and a second reflecting element group 112 consisting of a plurality of concave reflector elements 102 arranged in parallel. Parallel light incident to the entrance-side first reflecting element group 111 is divided by the individual concave reflector elements 101 to be focused on or near the corresponding concave reflector elements 102 of the exit-side second reflecting element group 112. Rays diverging from a point on one concave reflector element 101 in the first reflecting element group 111 are focused via a corresponding concave reflector element 102 in the second reflecting element group 112 and via a condenser optical system 103 on a surface to be illuminated (a pattern surface of reflective mask) 104. Namely, the entrance surface of the first reflecting element group 111 (reflecting surfaces of the concave reflector elements 101) are approximately optically conjugate with the surface to be illuminated 104.

In the conventional reflective optical integrator described above, therefore, the distance between the entrance surface and the exit surface, i.e., the distance between the first reflecting element group 111 and the second reflecting element group 112 is almost uniquely determined depending upon the specifications of the optical integrator. Specifically, the distance between the first reflecting element group 111 and the second reflecting element group 112 depends on the focal length of the entrance-side first reflecting element group 111 and a degree of convergence of the incident beam to the optical integrator, and, since it is common practice to introduce parallel light into the optical integrator, the distance is substantially dependent only on the focal length of the entrance-side first reflecting element group 111.

For example, in the case of the reflecting optical system in the illumination optical apparatus mounted on the EUVL exposure apparatus, smaller degrees of freedom for design of the distance between the entrance surface and exit surface of the reflective optical integrator can be disadvantageous in terms of interference between a light beam and an optical member, or the like. Namely, with reference to FIG. 15, as the distance becomes smaller between the entrance surface and exit surface of the optical integrator, the input light has to be obliquely incident at a large angle of incidence to the concave reflector elements 101 of the first reflecting element group 111 in order to avoid interference between a beam and an optical member. This results in causing such inconveniences that aberration is readily produced and that reflecting films of the concave reflector elements 101 and 102 fail to secure a sufficient reflectance for the obliquely incident light.

The present invention has been accomplished in view of the above problem and an object of the invention is to provide an optical integrator of a wavefront dividing type permitting an arbitrary distance to be set between an entrance surface and an exit surface, for example, without production of aberration and without reduction in reflectance on reflecting films. Another object of the present invention is to provide an illumination optical apparatus capable of illuminating a surface to be illuminated, under a desired illumination condition, using an optical integrator permitting an arbitrary distance to be set between an entrance surface and an exit surface. Still another object of the present invention is to provide an exposure apparatus and exposure method capable of performing good projection exposure under a good illumination condition, using an illumination optical apparatus for illuminating a mask as a surface to be illuminated, under a desired illumination condition.

Means for Solving The Problem

In order to solve the above problem, a first aspect of the present invention provides an optical integrator of a wavefront dividing type comprising:

a plurality of first focusing elements arranged in parallel; a plurality of second focusing elements arranged in parallel so as to correspond to the plurality of first focusing elements; and a relay optical system disposed in an optical path between the plurality of first focusing elements and the plurality of second focusing elements, wherein the relay optical system refocuses a light beam focused via one of the first focusing elements, on or near a corresponding second focusing element so as to establish an imaging relation of one-to-one correspondence between one of the first focusing elements and one of the second focusing elements.

A second aspect of the present invention provides an illumination optical apparatus for illuminating a surface to be illuminated, based on light from a light source, the illumination optical apparatus comprising the optical integrator of the first aspect disposed in an optical path between the light source and the surface to be illuminated.

A third aspect of the present invention provides an exposure apparatus comprising the illumination optical apparatus of the second aspect, and adapted for performing exposure of a photosensitive substrate with a pattern of a mask placed on the surface to be illuminated.

A fourth aspect of the present invention provides an exposure method of illuminating a mask placed on the surface to be illuminated, via the illumination optical apparatus of the second aspect, for exposure of a photosensitive substrate with a pattern of the mask.

A fifth aspect of the present invention provides an optical integrator of a wavefront dividing type comprising:

a plurality of first mirror elements arranged in parallel; a plurality of second mirror elements arranged in parallel so as to correspond to the plurality of first mirror elements; and a relay mirror disposed in an optical path between the plurality of first mirror elements and the plurality of second mirror elements, wherein the relay mirror refocuses a light beam focused via one of the first mirror elements, on or near a corresponding second mirror element so as to establish an imaging relation of one-to-one correspondence between one of the first mirror elements and one of the second mirror elements.

A sixth aspect of the present invention provides an optical integrator of a wavefront dividing type comprising:

a plurality of first mirror elements arranged in parallel; a plurality of second mirror elements arranged in parallel so as to correspond to the plurality of first mirror elements; and a relay mirror disposed in an optical path between the plurality of first mirror elements and the plurality of second mirror elements, wherein angles of incidence of light to the first mirror elements, to the second mirror elements, and to the relay mirror are within 20°.

A seventh aspect of the present invention provides an illumination optical apparatus for illuminating a surface to be illuminated, based on light from a light source, the illumination optical apparatus comprising the optical integrator of the fifth aspect or the sixth aspect disposed in an optical path between the light source and the surface to be illuminated.

An eighth aspect of the present invention provides an exposure apparatus comprising the illumination optical apparatus of the seventh aspect, and adapted for exposure of a photosensitive substrate with a pattern of a mask placed on the surface to be illuminated.

A ninth aspect of the present invention provides an exposure method of illuminating a mask placed on the surface to be illuminated, via the illumination optical apparatus of the seventh aspect, for exposure of a photosensitive substrate with a pattern of the mask.

A tenth aspect of the present invention provides a method of fabricating a device, comprising:

an exposure step of performing exposure of the photosensitive substrate with the predetermined pattern, using the exposure apparatus described in the third aspect or in the eighth aspect; and a development step of developing the photosensitive substrate having passed through the exposure step.

In the optical integrator according to the typical aspects of the present invention, the relay optical system disposed in the optical path between the plurality of first concave reflector elements (first focusing elements) and the plurality of second concave reflector elements (second focusing elements) arranged in parallel so as to correspond to each other, refocuses a light beam focused via one of the first concave reflector elements, on or near a corresponding second concave reflector element so as to establish the imaging relation of one-to-one correspondence between one of the first concave reflector elements and one of the second concave reflector elements. Therefore, the optical integrator of the present invention permits us to relatively freely set the distance between the entrance surface and the exit surface, i.e., the distance between the first concave reflector elements and the second concave reflector elements, independent of the focal length of the first concave reflector elements. As a result, it becomes easy to avoid interference between a beam and an optical member, without need for making light incident at a large angle of incidence to the first concave reflector elements, and, in turn, it becomes feasible to suppress production of aberration, reduction in reflectance on reflecting films, etc. due to the oblique incidence of light.

In other words, the present embodiment realizes the optical integrator of the wavefront dividing type permitting an arbitrary distance to be set between the entrance surface and the exit surface, for example, without production of aberration and without reduction in reflectance on reflecting films. The illumination optical apparatus of the present embodiment is able to illuminate the surface to be illuminated, under a desired illumination condition, using the optical integrator permitting an arbitrary distance to be set between the entrance surface and the exit surface. The exposure apparatus and exposure method of the present embodiment permit us to fabricate good devices by good projection exposure under a good illumination condition, using the illumination optical apparatus for illuminating a mask as a surface to be illuminated, under a desired illumination condition.

BEST MODE FOR CARRYING OUT THE INVENTION

Figure 1:
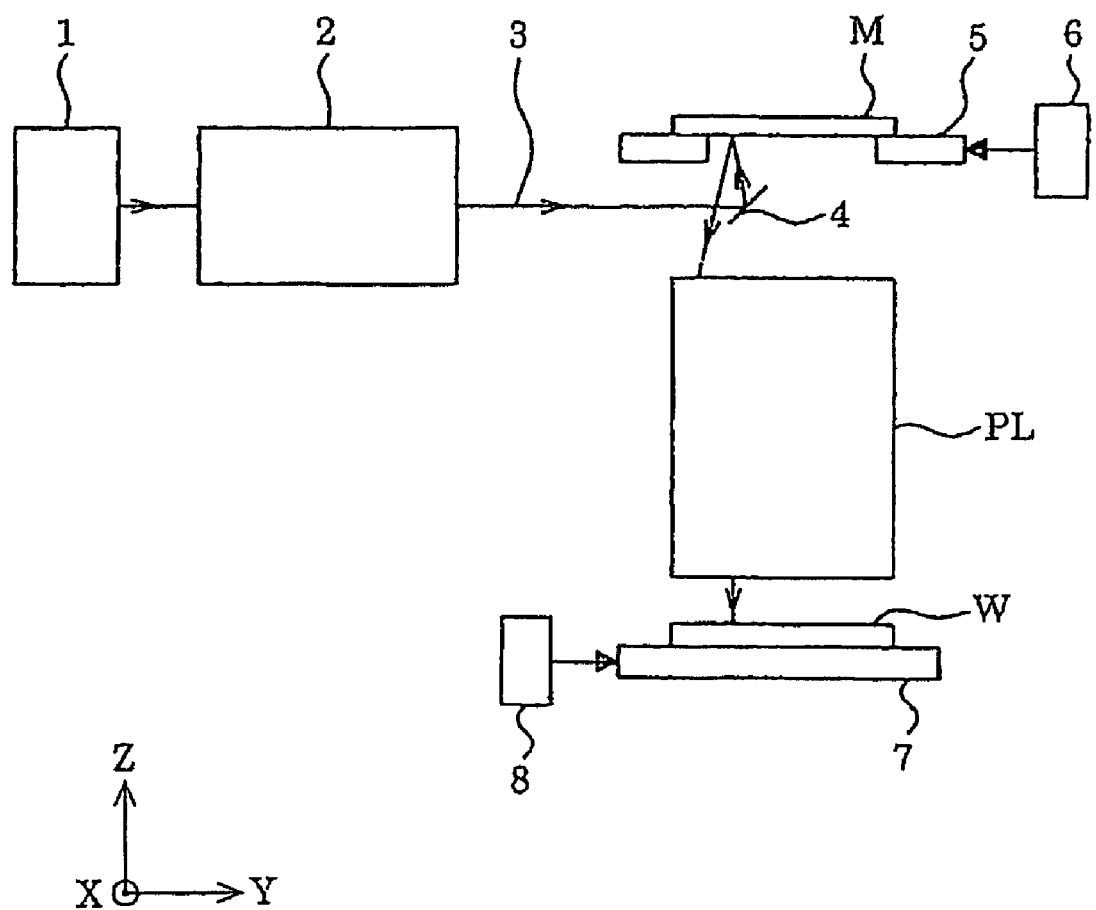
FIG. 1 is a drawing schematically showing an overall configuration of an exposure apparatus according to a first embodiment.
Figure 2:
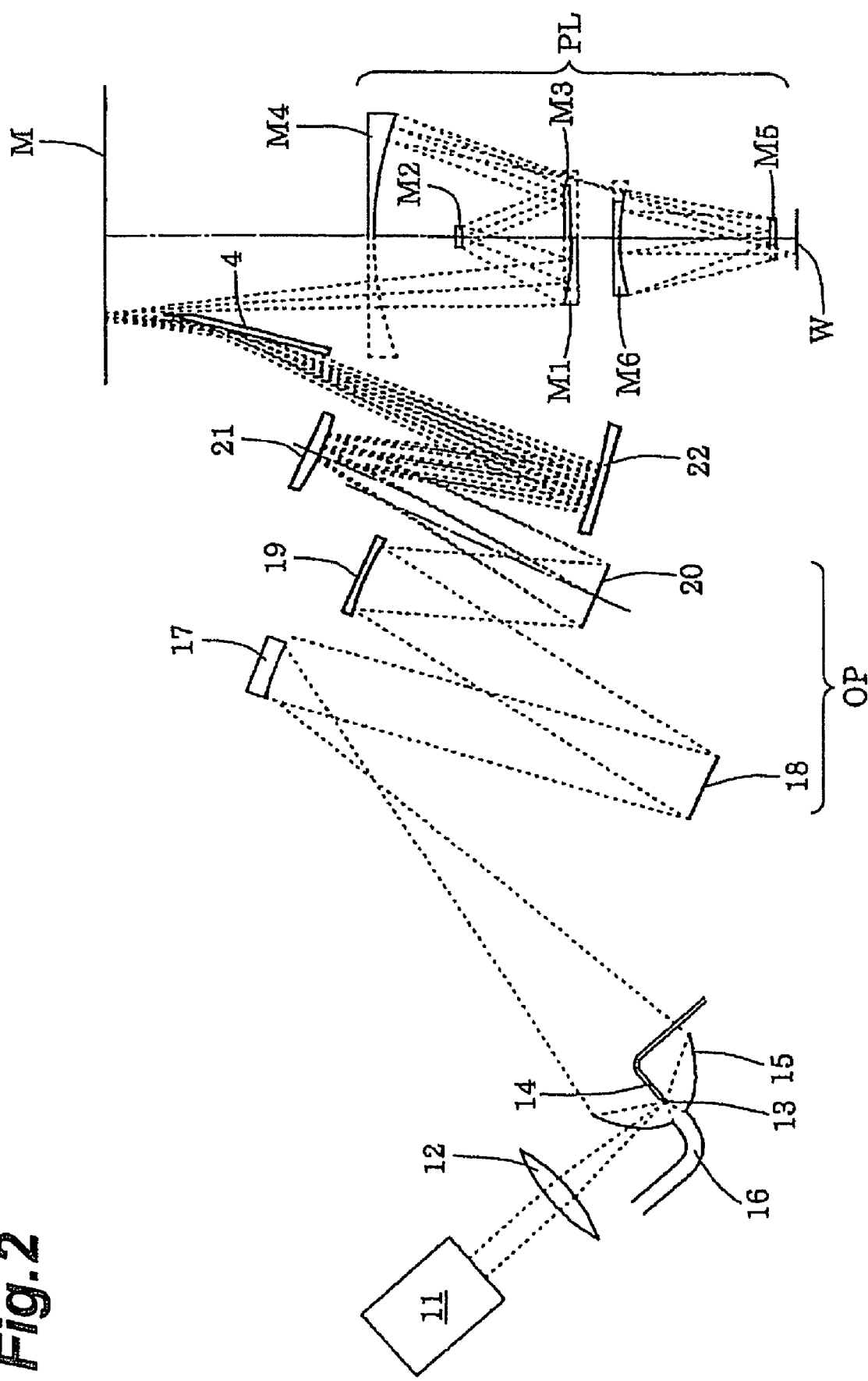
FIG. 2 is a drawing schematically showing internal configurations of a light source, an illumination optical system, and a projection optical system.

Embodiments of the present invention will be described on the basis of the accompanying drawings. FIG. 1 is a drawing schematically showing an overall configuration of an exposure apparatus according to the first embodiment of the present invention. FIG 2 is a drawing schematically showing internal configurations of a light source, illumination optical system, and projection optical system shown in FIG 1. In FIG. 1, a Z-axis is set along a direction of an optical axis of the projection optical system, i.e., along a direction of a normal to a surface of wafer W being a photosensitive substrate, a Y-axis along a direction parallel to the plane of FIG. 1 in the plane of wafer W, and an X-axis along a direction normal to the plane of FIG. 1 in the plane of wafer W. In the first embodiment, the present invention is applied to an EUVL exposure apparatus with a laser plasma light source.

Referring to FIG. 1, the exposure apparatus of the first embodiment has a light source for supplying exposure light, e.g., a laser plasma light source 1. Light emitted from the light source 1 is guided through a wavelength-selecting filter (not shown) to enter an illumination optical system 2. The wavelength-selecting filter herein has such characteristics as to selectively transmit only EUV light of a predetermined wavelength (e.g., 13.4 nm or 11.5 nm) and to interrupt light of the other wavelengths out of the light supplied from the light source 1. The EUV light 3 having passed through the wavelength-selecting filter travels via the illumination optical system 2 and a plane reflecting mirror 4 as a path deflector to illuminate a reflective mask (reticle) M in which a pattern to be transferred is formed.

The mask M is held by a mask stage 5, which is movable along the Y-direction, so that a pattern surface thereof extends along the XY plane. A laser interferometer 6 is arranged to measure movement of the mask stage 5. The light from the pattern of mask M illuminated is guided via a reflective projection optical system PL to form an image of the mask pattern on a wafer W being a photosensitive substrate. Namely, for example, an arcuate static exposure region (effective exposure region) symmetric with respect to the Y-axis is formed on the wafer W, as described later.

The wafer W is held by a wafer stage 7, which is two-dimensionally movable along the X-direction and the Y-direction, so that an exposure surface thereof extends along the XY plane. A laser interferometer 8 is arranged to measure movement of the wafer stage 7, as in the case of the mask stage 5. While the mask stage 5 and wafer stage 7 are moved along the Y-direction, i.e., while the mask M and wafer W are moved relative to the projection optical system PL along the Y-direction, scanning exposure (scan exposure) is performed to transfer the pattern of mask M into one rectangular shot area of the wafer W.

When a projection magnification (transfer magnification) of the projection optical system PL is, for example, ¼, synchronous scanning is performed in such setting that a moving speed of the wafer stage 7 is set to a quarter of a moving speed of the mask stage 5. The scanning exposure is repeated while two-dimensionally moving the wafer stage 7 along the X-direction and Y-direction, whereby the pattern of mask M is sequentially transferred into each of shot areas of the wafer W.

With reference to FIG. 2, the laser plasma light source 1 is arranged so that light (non-EUV light) emitted from a laser light source 11 is focused on a gas target 13 by a condenser lens 12. For example, a high-pressure gas consisting of xenon (Xe) is supplied from a nozzle 14 and the gas ejected from the nozzle 14 forms the gas target 13. The gas target 13 is given energy by the focused laser beam to turn into a plasma, which emits EUV light. The gas target 13 is positioned at a first focus of an ellipsoidal reflector 15.

Therefore, the EUV light emitted from the laser plasma light source 1 is focused at a second focus of the ellipsoidal reflector 15. On the other hand, the gas after the emission is drawn through a duct 16 to the outside. The EUV light focused at the second focus of the ellipsoidal reflector 15 is guided via a concave reflecting mirror 17 to become a nearly parallel beam and enter an optical integrator OP. The optical integrator OP is comprised of a pair of fly eye mirrors 18 and 20, and a concave reflecting mirror 19 as a relay optical system disposed in the optical path between the fly eye mirrors, and the detailed configuration and action thereof will be described later.

The beam incident to the optical integrator OP (18-20) forms a substantial surface illuminant (secondary light source) of a predetermined shape near the reflecting surface of the second fly eye mirror 20, i.e., near the exit surface of the optical integrator OP. Here the substantial surface illuminant is formed at or near the position of the exit pupil of the illumination optical system 2, i.e., on or near a plane optically conjugate with the entrance pupil of the projection optical system PL. Light from the substantial surface illuminant is guided via a condenser optical system (21, 22) as a light-guiding optical system comprised of a convex reflecting mirror 21 and a concave reflecting mirror 22, to be outputted from the illumination optical system 2.

The light outputted from the illumination optical system 2 is deflected by the plane reflecting mirror 4 and then travels through an arcuate aperture portion (light transmitting portion) of a field stop (not shown) disposed approximately in parallel with and in the vicinity of the mask M, to form an arcuate illumination region on the mask M. In this manner, the light source 1 (11-16), illumination optical system 2 (17-22), plane reflecting mirror 4, and field stop (not shown) constitute an illumination optical apparatus for implementing Köhler illumination on the mask M provided with the predetermined pattern.

Light from the pattern of the mask M illuminated is guided via the projection optical system PL to form an image of the mask pattern in an arcuate static exposure region on the wafer W. The projection optical system PL is comprised of a first reflective imaging optical system for forming an intermediate image of the pattern of mask M, and a second reflective imaging optical system for forming an image of the intermediate image of the mask pattern (i.e., a secondary image of the pattern of the mask M) on the wafer W. The first reflective imaging optical system is comprised of four reflecting mirrors M1-M4, and the second reflective imaging optical system is comprised of two reflecting mirrors M5 and M6. The projection optical system PL is an optical system telecentric on the wafer side (image side).

Figure 3:
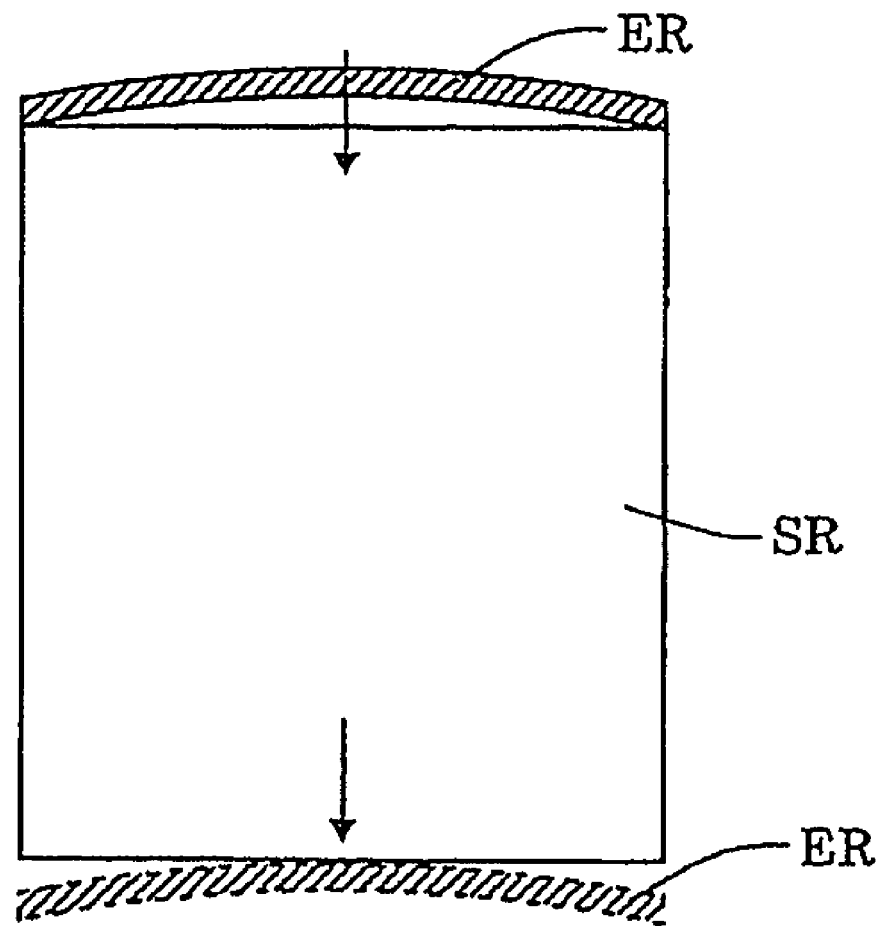
FIG. 3 is a drawing schematically illustrating one scanning exposure process in the first embodiment.
Figure 3:
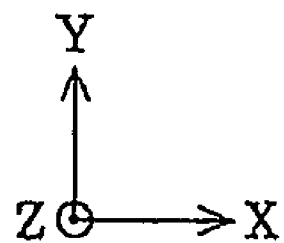

FIG. 3 is a drawing schematically illustrating one scanning exposure process in the first embodiment. Referring to FIG. 3, during a process of transferring the pattern of the mask M into one rectangular shot area SR in the wafer W by one scanning exposure (scan exposure), the arcuate static exposure region (effective exposure region) ER symmetric with respect to the Y-axis moves from a scan start position indicated by solid lines in the drawing to a scan end position indicated by dashed lines in the drawing.

Figure 4:
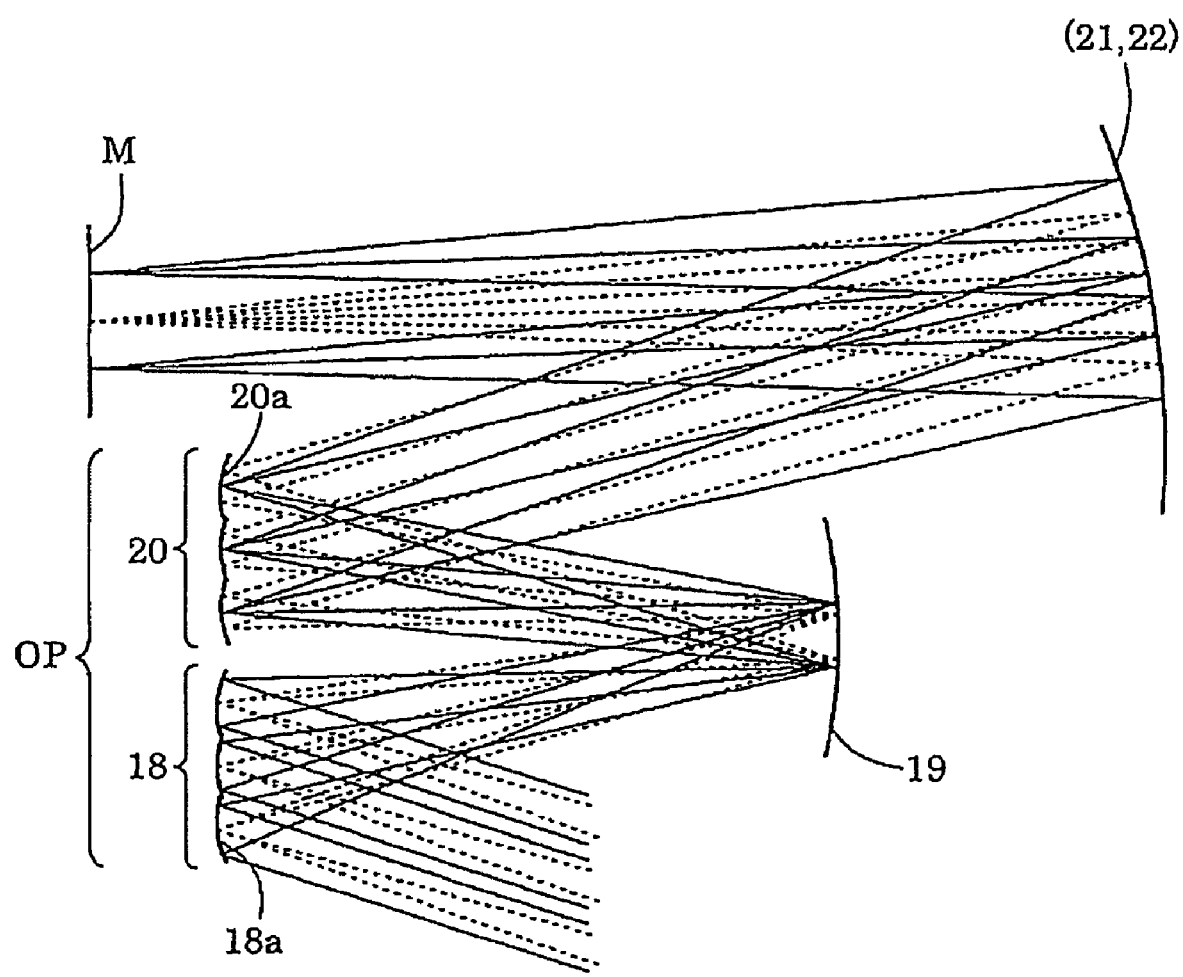
FIG. 4 is a drawing schematically showing a configuration and action of an optical integrator according to the first embodiment.

FIG. 4 is a drawing schematically showing the configuration and action of the optical integrator in the first embodiment. Referring to FIG. 4, the optical integrator OP of the first embodiment is comprised of a first fly eye mirror 18 consisting of a plurality of first concave reflector elements (first mirror elements; first focusing elements) 18a arranged in parallel; a second fly eye mirror 20 consisting of a plurality of second concave reflector elements (second mirror elements; second focusing elements) 20a arranged in parallel so as to correspond to the plurality of first concave reflector elements 18a; and a concave reflecting mirror (relay mirror) 19 as a relay optical system disposed in the optical path between the pair of fly eye mirrors 18 and 20. In FIG. 4, for clarification of the drawing, the condenser optical system (21, 22) is illustrated as a single concave reflecting mirror, and the concave reflector elements 18a, 20a forming the pair of fly eye mirrors 18, 20 are illustrated only by a number much smaller than the actual number.

Figure 5:
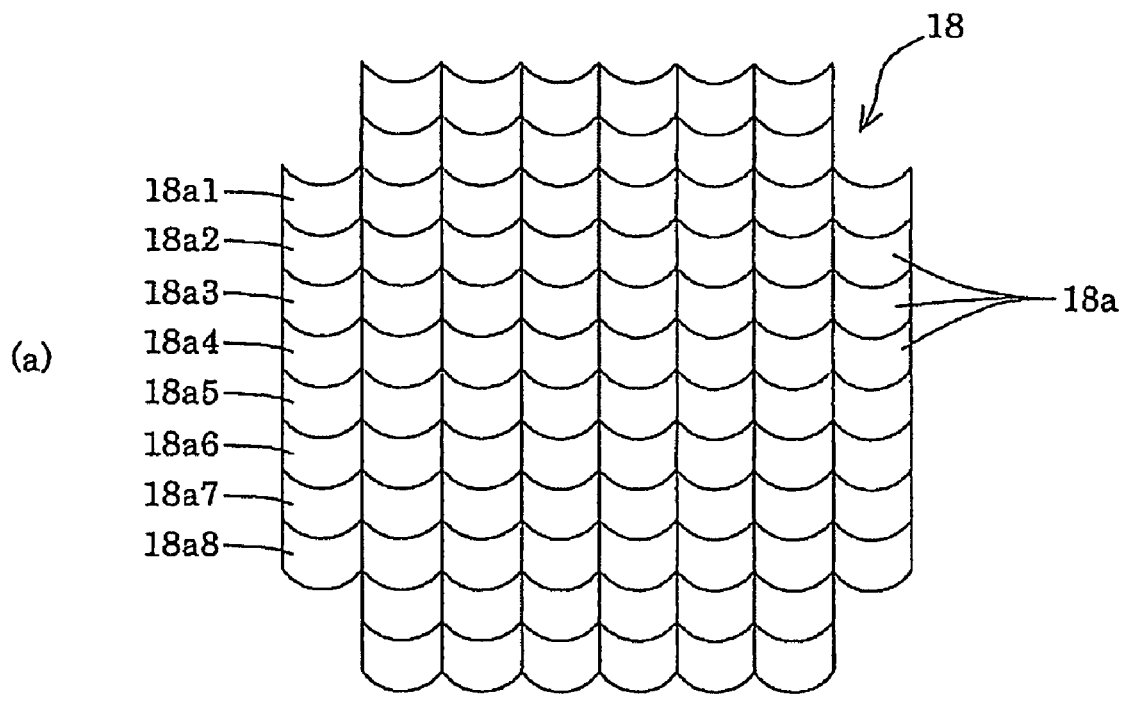
FIG. 5 is a drawing schematically showing configurations of an entrance surface of a first fly eye mirror and an entrance surface of a second fly eye mirror forming the optical integrator of FIG. 4, which are viewed from a traveling direction of light.
Figure 5:
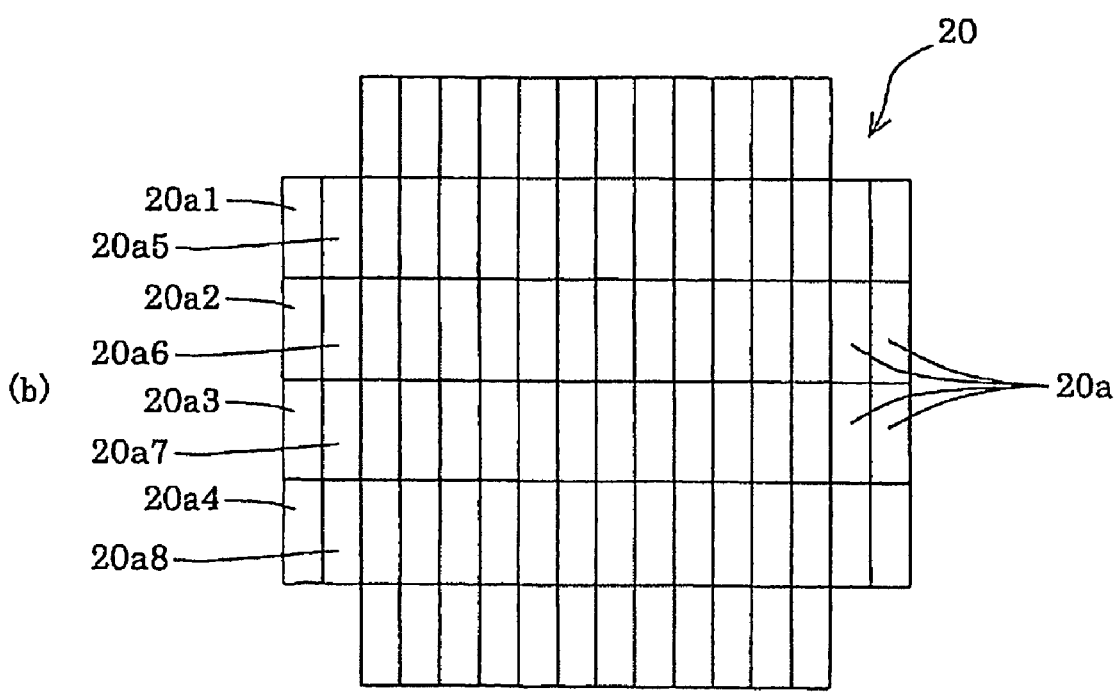

The first fly eye mirror 18, as shown in FIG. 5(a), is comprised of first concave reflector elements 18a of an arcuate outer shape arranged vertically and horizontally and densely. On the other hand, the second fly eye mirror 20, as shown in FIG. 5(b), is comprised of second concave reflector elements 20a of a rectangular outer shape arranged vertically and horizontally and almost densely. Namely, the first concave reflector elements 18a and the second concave reflector elements 20a have their respective optical surfaces (reflecting surfaces) of the outer shapes different from each other. The pattern of parallel arrangement of the first concave reflector elements 18a is different from the pattern of parallel arrangement of the second concave reflector elements 20a, which will be described later. Since a sectional shape of the beam incident to the optical integrator OP is nearly circular, the contour of the first fly eye mirror 18, when viewed from the traveling direction of light, is a shape close to a circular shape in order to enhance illumination efficiency (cf. FIG. 5(a)).

In the first embodiment each of the first concave reflector elements 18a, the second concave reflector elements 20a, and the concave reflecting mirror 19 is constructed as a toric mirror. Namely, in the concave reflector elements 18a and 20a, the focal length in the direction parallel to the plane of FIG. 4 is different from the focal length in the direction normal to the plane of FIG. 4. The concave reflecting mirror 19 as a relay optical system has mutually different focal lengths in the direction parallel to the plane of FIG. 4 and in the direction normal to the plane of FIG. 4, and thus has object-image distances different from each other in these two directions eventually.

In the optical integrator OP of the first embodiment, when a parallel beam is incident to the first fly eye mirror 18, as indicated by solid lines in the drawing, the incident light is subjected to wavefront dividing by the individual first concave reflector elements 18a. A beam reflected by each first concave reflector element 18a is focused once, and thereafter travels via the concave reflecting mirror 19 as a relay optical system to be focused at a point on or near a reflecting surface of a corresponding second concave reflector element 20a. In this manner, a substantial surface illuminant is formed on or near the exit surface of the optical integrator OP.

However, since the first concave reflector elements 18a are constructed as toric mirrors as described above, a position where a beam reflected by a first concave reflector element 18a is focused at a point in a plane parallel to the plane of FIG. 4 is different from a position where the beam is focused at a point in a plane normal to the plane of FIG. 4. Beams each of which is focused at a point on or near a reflecting surface of a second concave reflector element 20a, i.e., beams from respective light sources forming the substantial surface illuminant are guided via the condenser optical system (21, 22) to illuminate the arcuate illumination region on the mask M as a surface to be illuminated, in a superimposed manner.

As described above, the concave reflecting mirror (relay optical system) 19 refocuses a beam focused via one of the first concave reflector elements 18a, on or near a corresponding second concave reflector element 20a so as to establish an imaging relation of one-to-one correspondence between one of the first concave reflector elements 18a forming the first fly eye mirror 18 and one of the second concave reflector elements 20a forming the second fly eye mirror 20. Specifically, let us focus our attention on eight first concave reflector elements 18a1-18a8 in the leftmost column in FIG. 5(a); the four upper first concave reflector elements 18a1-18a4 correspond to four second concave reflector elements 20a1-20a4, respectively, in the leftmost column in FIG. 5(b).

The four lower first concave reflector elements 18a5-18a8 correspond to four second concave reflector elements 20a5-20a8, respectively, in the second column from the left in FIG. 5(b). The first concave reflector elements 18a in one column in the first fly eye mirror 18 correspond to the second concave reflector elements 20a in two columns in the second fly eye mirror 20 as described above; therefore, the first fly eye mirror 18 is of 8-column structure, while the second fly eye mirror 20 is of 16-column structure.

On the other hand, rays diverging from a point on a reflecting surface of each first concave reflector element 18a, as indicated by dashed lines in the drawing, are guided via the concave reflecting mirror 19 as a relay optical system to be focused once, and thereafter are incident to a corresponding second concave reflector element 20a. Since the concave reflecting mirror 19 is also constructed as a toric mirror as described above, a position where a beam reflected by the concave reflecting mirror 19 is focused at a point in a plane parallel to the plane of FIG. 4 is different from a position where the beam is focused at a point in a plane normal to the plane of FIG. 4. A beam reflected by each second concave reflector element 20a is guided via the condenser optical system (21, 22) to be focused at a point in the arcuate illumination region on the mask M. In the optical integrator OP of the first embodiment, as described above, each of the reflecting surfaces of all the first concave reflector elements 18a forming the first fly eye mirror 18 is arranged so as to be conjugate with the pattern surface of the mask M.

Incidentally, the reason why the first concave reflector elements 18a forming the first fly eye mirror 18 have the arcuate outer shape is that the arcuate illumination region can efficiently be illuminated on the mask M. The reason why the second concave reflector elements 20a forming the second fly eye mirror 20 have the rectangular outer shape vertically long is that the light source images formed on or near the reflecting surfaces of the second concave reflector elements 20a are of a vertically long elliptic shape. When the etendue of the light source is close to that of the apparatus, this configuration can improve transmission efficiency of optical energy. A preferred configuration is such that a clearance is provided between the second concave reflector elements 20a forming the second fly eye mirror 20, to provide an adjustment margin in positioning of the individual second concave reflector elements 20a, i.e., to enable positional adjustment of the individual second concave reflector elements 20a.

In the optical integrator OP of the first embodiment, as described above, the concave reflecting mirror 19 as a relay optical system is disposed in the optical path between the first fly eye mirror 18 and the second fly eye mirror 20. The concave reflecting mirror (relay optical system) 19 refocuses a light beam focused via one of the first concave reflector elements 18a, on or near a corresponding second concave reflector element 20a so as to establish an imaging relation of one-to-one correspondence between one of the first concave reflector elements 18a forming the first fly eye mirror 18 and one of the second concave reflector elements 20a forming the second fly eye mirror 20.

In the optical integrator OP of the first embodiment, therefore, the distance between the entrance surface and the exit surface, i.e., the distance between the first fly eye mirror 18 and the second fly eye mirror 20 is permitted to be relatively freely set independent of the focal length of the first fly eye mirror 18. As a result, it is easy to avoid interference between a beam and an optical member, without need for making the light incident at a large angle of incidence to each first concave reflector element 18a forming the first fly eye mirror 18, and, in turn, it is feasible to suppress production of aberration, reduction in reflectance on reflecting films, etc. due to oblique incidence of light.

In other words, the first embodiment realizes the optical integrator OP of the wavefront dividing type permitting an arbitrary distance to be set between the entrance surface and the exit surface, for example, without production of aberration and without reduction in reflectance on reflecting films. The illumination optical apparatus of the first embodiment is able to illuminate the mask M as a surface to be illuminated, under a desired illumination condition, using the optical integrator OP permitting an arbitrary distance to be set between the entrance surface and the exit surface. The exposure apparatus of the first embodiment is able to perform good projection exposure under a good illumination condition, using the illumination optical apparatus for illuminating the mask M as a surface to be illuminated, under a desired illumination condition.

Incidentally, in the first embodiment, as described above, each of the reflecting surfaces of all the first concave reflector elements 18a forming the first fly eye mirror 18 is set to be conjugate with the pattern surface of the mask M (and with the exposure surface of the wafer W eventually). Therefore, in order to enhance illumination efficiency according to the conventional technology, the first concave reflector elements 18a are required to have an oblong arcuate outer shape similar to the outer shape of the illumination region on the mask M (in turn, the static exposure region ER on the wafer W) (cf. FIG. 3). On the other hand, since the sectional shape of the beam incident to the optical integrator OP is nearly circular as described above, the outer shape of the first fly eye mirror 18, when viewed from the traveling direction of light, is required to have a shape close to a circular shape (cf. FIG. 5(a)) in order to increase the illumination efficiency.

In the first fly eye mirror 18, the first concave reflector elements 18a need to be arranged in parallel by an enough number both in the horizontal direction and in the vertical direction, in order to achieve the required wavefront dividing effect. For this reason, if the outer shape of the first concave reflector elements 18a is set to the oblong arcuate shape similar to the outer shape of the static exposure region ER of the wafer W as in the conventional technology, the number of first concave reflector elements arranged along the transverse direction of the outer shape will become too large (cf. FIG. 12(b) for the second embodiment described later), which will adversely affect the production cost of the first fly eye mirror 18 and, in turn, the production cost of the optical integrator OP.

In the first embodiment, as described above, each of the first concave reflector elements 18a, the second concave reflector elements 20a, and the concave reflecting mirror 19 is constructed as a toric mirror, and thus the outer shape of the first concave reflector elements 18a can be set to the relatively wide arcuate shape of an aspect ratio different from that of the outer shape of the static exposure region ER of the wafer W. As a result, in the first fly eye mirror 18 of the first embodiment, as shown in FIG. 5(a), the number of first concave reflector elements 18a arranged along the transverse direction of the arcuate outer shape (the vertical direction in the drawing) is not too large, which can keep the production cost of the first fly eye mirror 18 low and, in turn, the production cost of the optical integrator OP low.

In the first embodiment, as described above, the light source images formed on or near the reflecting surfaces of the second concave reflector elements 20a are of the vertically long elliptic shape, and the second concave reflector elements 20a forming the second fly eye mirror 20 have the vertically long rectangular outer shape in order to improve the transmission efficiency of optical energy. For this reason, if the second concave reflector elements 20a are arranged in parallel in the same pattern as the pattern of parallel arrangement of the first concave reflector elements 18a according to the conventional technology, the contour of the second fly eye mirror 20, when viewed from the traveling direction of light, will become extremely thin and long along the longitudinal direction of the second concave reflector elements 20a of the rectangular shape (the vertical direction in FIG. 5(b)).

In the first embodiment, as described above, the pattern of parallel arrangement of the first concave reflector elements 18a is different from the pattern of parallel arrangement of the second concave reflector elements 20a. Specifically, the first concave reflector elements 18a in one column of the first fly eye mirror 18 correspond to the second concave reflector elements 20a in two columns of the second fly eye mirror 20, the first fly eye mirror 18 is of the 8-column structure, and the second fly eye mirror 20 is of the 16-column structure. As a result, in the second fly eye mirror 20 of the first embodiment, as shown in FIG. 5(b), the contour of the second fly eye mirror 20, viewed from the traveling direction of light, is the shape close to the circular shape as in the case of the first fly eye mirror 18.

The EUVL exposure apparatus of the first embodiment described above uses the laser plasma light source as a light source for supplying EUV light. However, without having to be limited to this, the light source can be any other adequate light source for supplying EUV light, e.g., a synchrotron (SOR) light source.

Figure 6:
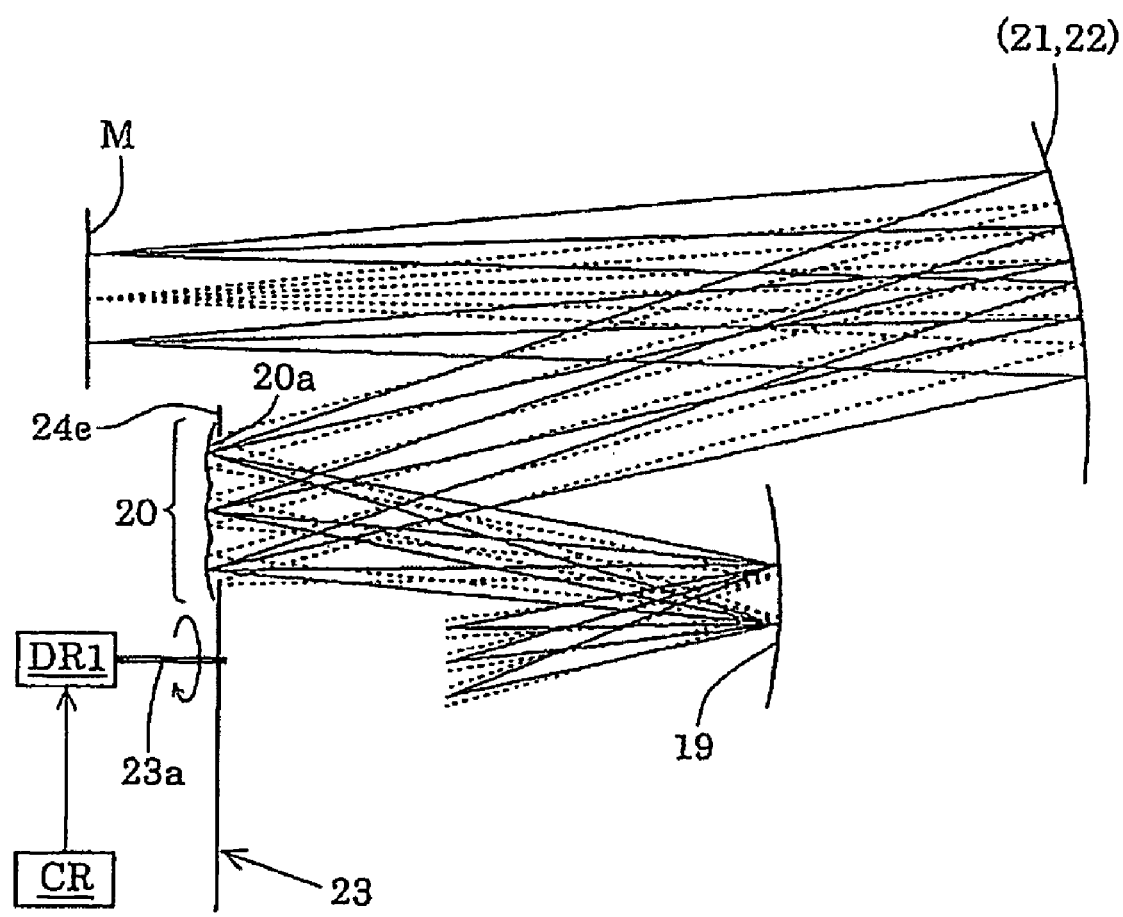
FIG. 6 is a drawing schematically illustrating a σ-value varying technique in the first embodiment.

Next, let us describe with reference to FIG. 6, a σ-value varying technology of varying the size of the secondary light source (optical intensity distribution formed on the illumination pupil) formed near the exit surface of the optical integrator OP (i.e., near the exit surface of the second fly eye mirror 20) and, in turn, varying the σ-value (or coherence factor) in the EUVL exposure apparatus of the above-described first embodiment. The σ-value is a value defined by σ=NA1/NA2, where NA1 represents the mask-side numerical aperture of the illumination optical system 2 (17-22) and NA2 the mask-side numerical aperture of the projection optical system PL.

It becomes necessary to vary the σ-value (σ=NA1/NA2: ratio of the mask-side numerical aperture NA1 of the illumination optical system 2 to the mask-side numerical aperture NA2 of the projection optical system PL) to adjust the resolving power, the depth of focus, etc. of the projection optical system PL, depending upon fineness of a pattern to be transferred onto the wafer W and a process of a pattern to be transferred onto the wafer W. For this reason, as shown in FIG. 6, exposure information about exposure conditions for respective wafers successively mounted on the wafer stage 7 (not shown in FIG. 6) (a conveyance map of wafers including exposure information, or the like), and mount information about various masks successively mounted on the mask stage 5 (not shown in FIG. 6) is fed through an input device (not shown), such as a console, to a controller CR.

The controller CR determines whether the σ-value is to be changed, based on the input information from the input device, every time a wafer W is mounted on the wafer stage 7. When the controller CR determines that the a-value needs to be changed, it actuates a driver DR1 to replace an aperture stop 24e for circular illumination located near the reflecting surface of the second fly eye mirror 20, with another aperture stop for circular illumination having a different aperture diameter. This allows the apparatus to achieve appropriate exposures under various exposure conditions. A turret method, a slide method, or the like can be used for the changeover between aperture stops. The following will describe an example in which the turret method is applied to the changeover between aperture stops.

Figure 7:
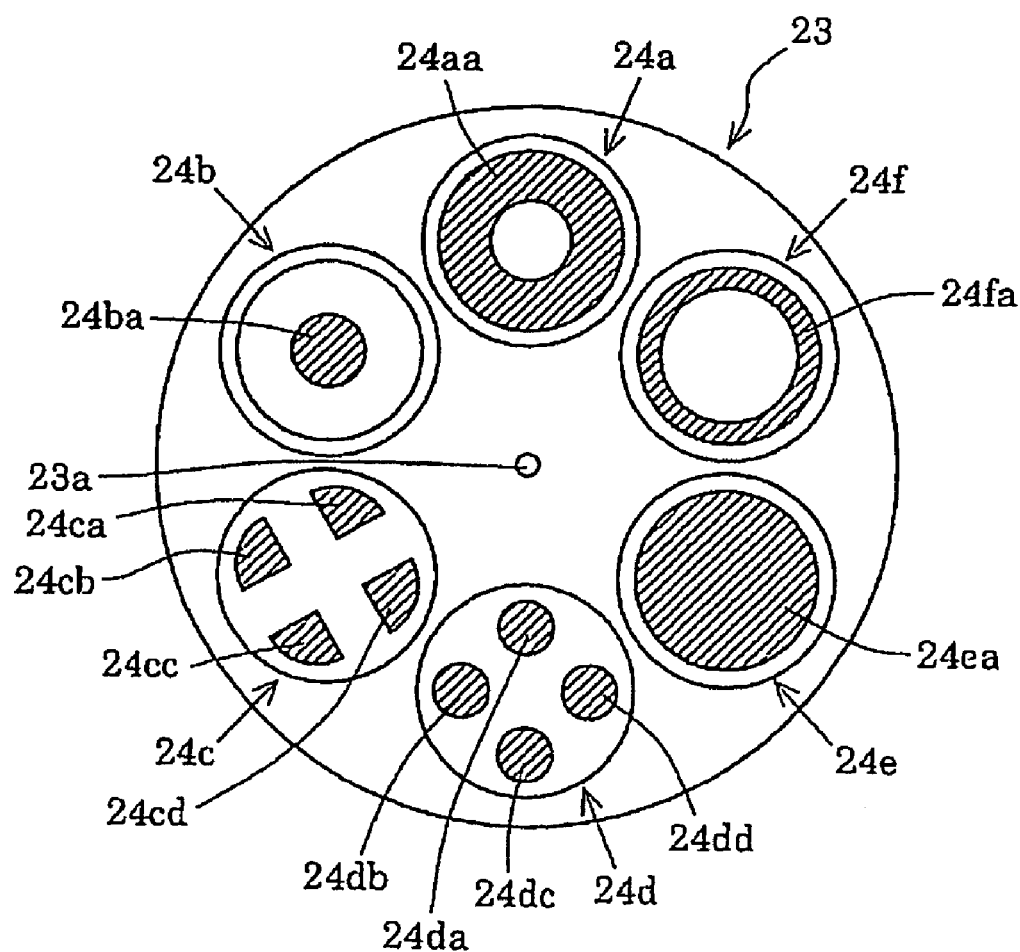
FIG. 7 is a drawing schematically showing a setup in which a turret plate is provided with a plurality of aperture stops.

Referring to FIG. 6, there is a turret plate 23 which can be rotated about a predetermined rotation axis 23a by action of the driver DR1. The turret plate 23, as shown in FIG. 7, is provided with a plurality of aperture stops 24a-24f (six aperture stops as an example in FIG. 7) different in the shape or size of the aperture portion (light transmitting portion) from each other. In FIG. 7, hatched regions correspond to the aperture portions of the respective aperture stops. Specifically, the aperture stop 24a is an aperture stop for annular illumination having an annular aperture portion 24aa, and aperture stops 24b and 24e are aperture stops for circular illumination having their respective aperture portions 24ba and 24ea of circular shape having different aperture diameters.

The aperture stop 24c is an aperture stop for quadrupole illumination having four fan-shaped aperture portions 24ca-24cd, and the aperture stop 24d an aperture stop for quadrupole illumination having four circular aperture portions 24da-24dd. The aperture stop 24f is an aperture stop for annular illumination having an aperture portion 24fa with an annular ratio different from that of the aperture stop 24a. The definition of the annular ratio, and use of the annular illumination aperture stops 24a, 24f and quadrupole illumination aperture stops 24c, 24d will be described later. It is noted that a variety of modification examples can be contemplated as to the number and arrangement of aperture stops, the shape and size of the aperture portions, etc. in the turret plate 23.

When the turret method or the slide method is applied to the changeover between aperture stops 24, it is necessary to secure a required space around the second fly eye mirror 20. FIG. 4 exemplifies the configuration in which the first fly eye mirror 18 and the second fly eye mirror 20 are arranged at nearly equal positions along the horizontal direction in the drawing, but the interposition of the relay optical system 19 permits a variety of configuration examples to be realized as to the horizontal positions of the first fly eye mirror 18 and the second fly eye mirror 20 in the horizontal direction in the drawing. Namely, the first fly eye mirror 18 can be located to the right side or to the left side in the drawing of the second fly eye mirror 20, whereby the required space can be secured around the second fly eye mirror 20 (cf. the arrangement in FIG. 1). In either case, the center of curvature of the reflecting surface of the relay optical system (relay mirror) 19 is present between the first concave reflector elements (first mirror elements) 18a and the relay optical system 19 or between the second concave reflector elements (second mirror elements) 20a and the relay optical system 19. When the reflecting surface of the relay optical system 19 is a toric surface, the centers of curvature of the reflecting surface in two mutually orthogonal directions are also preferably present between either one of the first concave reflector elements and the second concave reflector elements, and the relay optical system 19.

In general, if the σ-value is varied by changing the size of the aperture portion of circular shape to limit the optical intensity distribution of nearly circular shape formed on the illumination pupil (near the exit surface of the second fly eye mirror 20), the illumination state can worsen with occurrence of illumination unevenness (illuminance unevenness) or the like in the arcuate illumination region (static exposure region ER) formed on the wafer W or on the mask M. However, the first embodiment permits such design as to set the focal length of the first fly eye mirror 18 to a small value, as described above, whereby it becomes feasible to set the outer shapes of the first concave reflector elements (first mirror elements) 18a and the second concave reflector elements (second mirror elements) 20a small. In other words, the first embodiment permits the wavefront-dividing surfaces of the optical integrator OP to be set small, whereby occurrence of illumination unevenness due to change of the σ-value can be suppressed well without need for replacement of the concave reflecting mirror 17 as a collimating mirror.

Figure 8:
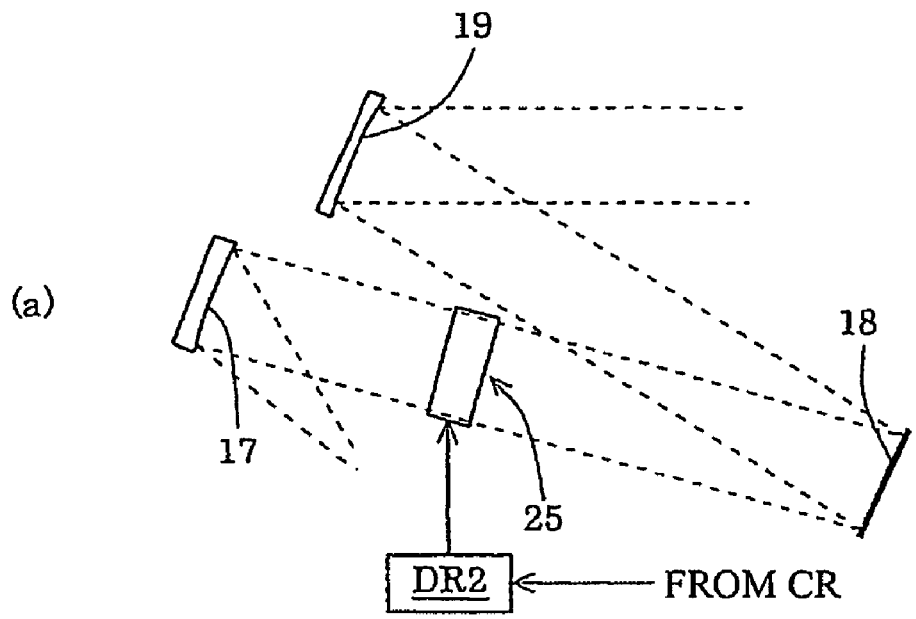
FIG. 8 is a drawing schematically illustrating an off-axis (modified) illumination technique in the first embodiment.
Figure 8:
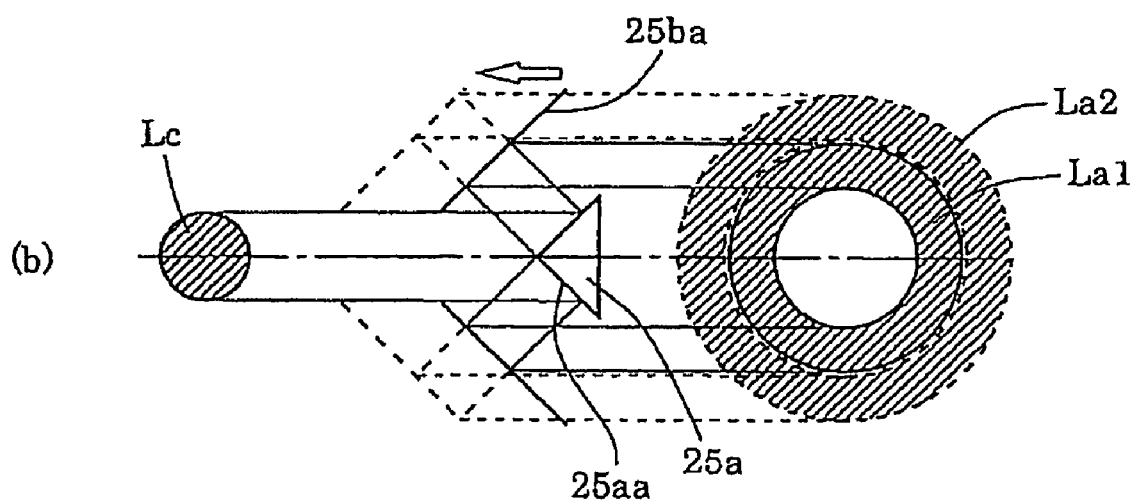

Next, let us describe with reference to FIG. 8, an off-axis (modified) illumination technique of improving the depth of focus and resolving power of the projection optical system PL by forming an optical intensity distribution of an annular shape or a multi-pole shape (dipole, quadrupole, or the like) on the illumination pupil (near the exit surface of the second fly eye mirror 20) in the EUVL exposure apparatus of the first embodiment. Referring to FIG. 8(a), a reflective conical axicon system 25 as an annular beam converting unit is provided in a retractable state relative to the illumination optical path between the concave reflecting mirror 17 as a collimating mirror and the first fly eye mirror 18. The conical axicon system 25 has a function of converting an EUV beam of a circular cross section into an EUV beam of an annular (ring) cross section.

As shown in FIG. 8(b), the conical axicon system 25 is comprised of the following members in the order of incidence of light: a first reflecting member 25a having a reflecting surface 25aa of a convex conical shape; and a second reflecting member 25b (the main body of which is omitted from the illustration in order to clarify the drawing) having a reflecting surface 25ba of an annular conical shape which is obtained by cutting an annular, rotationally symmetric region away from a concave conical surface complementary to the reflecting surface 25aa of the first reflecting member 25a. At least one of the first reflecting member 25a and the second reflecting member 25b is arranged movable along the optical axis AX, whereby the distance is variable between the reflecting surface 25aa of the first reflecting member 25a and the reflecting surface 25ba of the second reflecting member 25b.

Therefore, when an EUV beam Lc of a circular cross section is incident to the conical axicon system 25, the circular EUV beam Lc is radially reflected by the reflecting surface 25aa of the convex conical shape of the first reflecting member 25a to be converted into an annular beam, and the beam is guided via the reflecting surface 25ba of the concave conical shape of the second reflecting member 25b to become an annular EUV beam La1, which is guided to the first fly eye mirror 18 of the optical integrator OP. When the second reflecting member 25b is moved to the position indicated by dashed lines in the drawing to expand the distance between the reflecting surface 25aa of the first reflecting member 25a and the reflecting surface 25ba of the second reflecting member 25b, the resulting beam becomes an EUV beam La2 of an annular shape having a larger outside diameter and inside diameter, which is guided to the first fly eye mirror 18 of the optical integrator OP.

In this manner, an optical intensity distribution (secondary light source) of an annular shape is formed on the illumination pupil (near the exit surface of the second fly eye mirror 20) by action of the reflective conical axicon system 25. In general, if the distance varies between the reflecting surface 25aa of the first reflecting member 25a and the reflecting surface 25ba of the second reflecting member 25b, the outside diameter (inside diameter) of the secondary light source of annular shape will change while keeping the width of the secondary light source of the annular shape (half of the difference between the outside diameter and inside diameter of the annular secondary light source) constant. Namely, the annular ratio (inside diameter/outside diameter) and size (outside diameter) of the secondary light source of annular shape varies through action of the conical axicon system 25. The insertion/retraction of the conical axicon system 25 relative to the illumination optical path, and the relative movement between the first reflecting member 25a and the second reflecting member 25b along the illumination optical path are implemented by a driver DR2 which operates based on a command from the controller CR.

In the off-axis illumination technique, the controller CR selects one of "first annular illumination," "second annular illumination," "first normal circular illumination," "second normal circular illumination," "first quadrupole illumination," and "second quadrupole illumination," based on input information from an input device (not shown) for inputting necessary information for selection of an illumination condition on the mask M or on the wafer W. The input device is a device for inputting exposure information about exposure conditions for respective wafers successively mounted by an unrepresented conveying device (a conveyance map of wafers including exposure information, or the like) according to fineness of patterns to be transferred onto the wafers W and a process of patterns to be transferred onto the wafers W, and mount information about various masks successively mounted on the mask stage 5.

Here the "annular illumination" is defined as follows: the secondary light source is formed in an annular shape on the illumination pupil (near the exit surface of the second fly eye mirror 20) to illuminate the reflective mask M and wafer W obliquely with EUV light, thereby improving the original resolving power and depth of focus of the projection optical system PL. The "quadrupole illumination (more generally, multi-pole illumination)" is defined as follows: the secondary light source formed on the illumination pupil consists of four (multiple in general) discrete off-axis light sources decentered by a predetermined distance from the center of the secondary light source, to illuminate the reflective mask M and wafer W obliquely with EUV light, thereby improving the original resolving power and depth of focus of the projection optical system PL. The "normal circular illumination" is illumination in which the shape of the secondary light source formed on the illumination pupil is approximately circular so that the reflective mask M and wafer W are illuminated under an optimal σ-value.

For setting the illumination state on the mask M to the normal circular illumination, the controller CR selects "first normal circular illumination" or "second normal circular illumination," based on the input information from the input device. The difference between "first normal circular illumination" and "second normal circular illumination" is a difference of σ-value. For example, where the controller CR selects "first normal circular illumination," it drives the driver DR1 to rotate the turret plate 23 so that the aperture stop 24e is located at the position of the secondary light source (substantial surface illuminant consisting of a number of light sources) formed on the illumination pupil (near the exit surface of the second fly eye mirror 20). At the same time as it, the controller CR changes an aperture diameter of a variable aperture stop (not shown) in the projection optical system PL as occasion may demand. At this time, if the conical axicon system 25 is set in the illumination optical path, the controller CR actuates the driver DR2 to retract the conical axicon system 25 from the illumination optical path. When the pattern of the reflective mask M is illuminated with EUV light in the above setting condition, the pattern of the reflective mask M can be projected through the projection optical system PL onto the photosensitive substrate (wafer) W under an appropriate condition of "first normal circular illumination" (appropriate σ-value).

When the controller CR selects "second normal circular illumination," it drives the driver DR1 to rotate the turret plate 23 so that the aperture stop 24b is located at the position of the secondary light source formed on the illumination pupil. At the same time as it, the controller CR changes the aperture diameter of the variable aperture stop (not shown) in the projection optical system PL as occasion may demand. At this time, if the conical axicon system 25 is set in the illumination optical path, the controller CR actuates the driver DR2 to retract the conical axicon system 25 from the illumination optical path. When the pattern of the reflective mask M is illuminated with EUV light in the above setting condition, the pattern of the reflective mask M can be projected through the projection optical system PL onto the photosensitive substrate (wafer) W under an appropriate condition of "second normal circular illumination" (a σ-value larger than that in the first normal circular illumination).

Next, where the illumination state on the mask M is set to one of the various off-axis illuminations, the controller CR selects one of "first annular illumination," "second annular illumination," "first quadrupole illumination," and "second quadrupole illumination," based on the input information from the input device. Here the "first annular illumination" and "second annular illumination" are different in the annular ratio of the secondary light source of the annular shape from each other. The "first quadrupole illumination" and "second quadrupole illumination" are different mainly in the shape of the surface illuminant of each pole. Namely, the secondary light source in "first quadrupole illumination" consists of four fan-shaped regions, and the secondary light source in "second quadrupole illumination" consists of four circular regions.

For example, when "first annular illumination" is selected, the controller CR drives the driver DR1 to rotate the turret plate 23 so that the aperture stop 24a is located at the position of the secondary light source formed on the illumination pupil. When "second annular illumination" is selected, the controller CR drives the driver DR1 to rotate the turret plate 23 so that the aperture stop 24f is located at the position of the secondary light source formed on the illumination pupil. When "first quadrupole illumination" is selected, the controller CR drives the driver DR1 to rotate the turret plate 23 so that the aperture stop 24c is located at the position of the secondary light source formed on the illumination pupil. When "second quadrupole illumination" is selected, the controller CR drives the driver DR1 to rotate the turret plate 23 so that the aperture stop 24d is located at the position of the secondary light source formed on the illumination pupil.

At the same time as one of the four aperture stops (24a, 24c, 24d, 24f) is set in the illumination optical path, the controller CR changes the aperture diameter of the variable aperture stop (not shown) in the projection optical system PL as occasion may demand. Then the controller CR drives the driver DR2 to set the conical axicon system 25 as an annular beam converting unit on the illumination optical path and to adjust the conical axicon system 25. First, if the conical axicon system 25 is not set in the illumination optical path, the controller CR drives the driver DR2 to set the conical axicon system 25 at a predetermined position in the illumination optical path.

Next, the controller CR drives the driver DR2 to change the relative distance between the two reflecting members (25a, 25b) in the conical axicon system 25 so that the annular beam is efficiently guided to the aperture portion of one aperture stop among the four aperture stops (24a, 24c, 24d, 24f) set at the position of the secondary light source formed on the illumination pupil. This enables the conical axicon system 25 to convert the incident beam of nearly circular shape into an annular shape having an appropriate annular ratio. Through the setting and adjustment of the conical axicon system 25, the secondary light source having an appropriate annular ratio according to each aperture portion among the four aperture stops (24a, 24c, 24d, 24f) is formed on the illumination pupil, whereby the mask M and wafer W can be illuminated by off-axis illumination at high illumination efficiency.

In general, when the aperture stop (24a-24f) set in the illumination optical path is changed over by rotation of the turret plate 23, the illumination state can worsen with occurrence of illumination unevenness or the like in the arcuate illumination region (static exposure region ER) formed on the wafer W or on the mask M. However, the wavefront dividing surfaces of the optical integrator OP can be set small in the first embodiment as described above, whereby occurrence of illumination unevenness due to the changeover of the aperture stop (24a-24f) can be suppressed well without need for replacement of the concave reflecting mirror 17 as a collimating mirror.

The above description concerned the configuration wherein the information such as the illumination condition was fed through the input device to the controller CR, but it is also possible to adopt a configuration wherein there is a detector for reading information on the reflective mask M. In this case, information about an illumination method, e.g., a barcode or the like, is recorded outside a circuit pattern region of the mask M. The detector reads the information about the illumination condition and transmits it to the controller CR. The controller CR controls the drivers (DR1, DR2), based on the information about the illumination condition.

Figure 9:
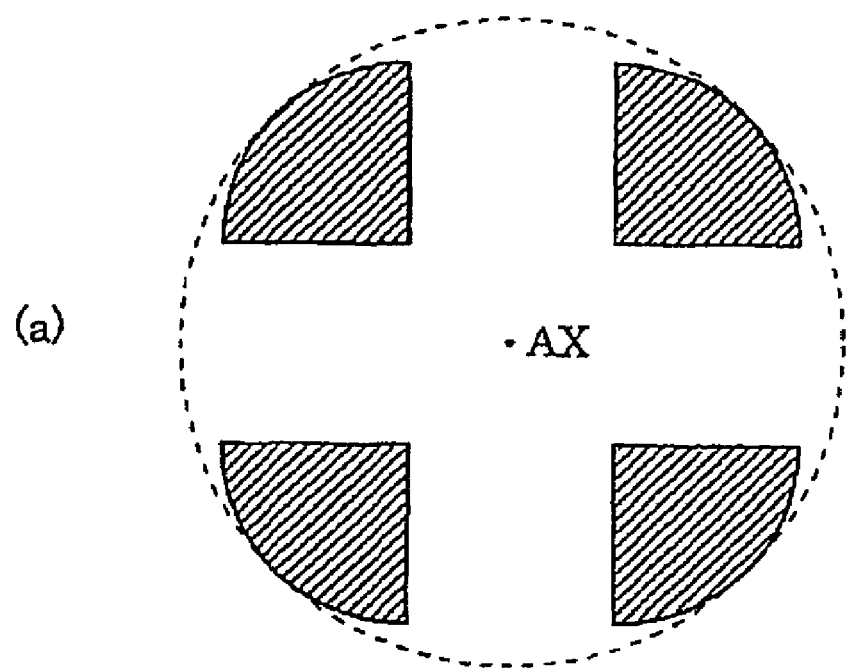
FIG. 9 is a drawing schematically showing a quadrupole secondary light source and a dipole secondary light source formed on an illumination pupil by off-axis illumination.
Figure 9:
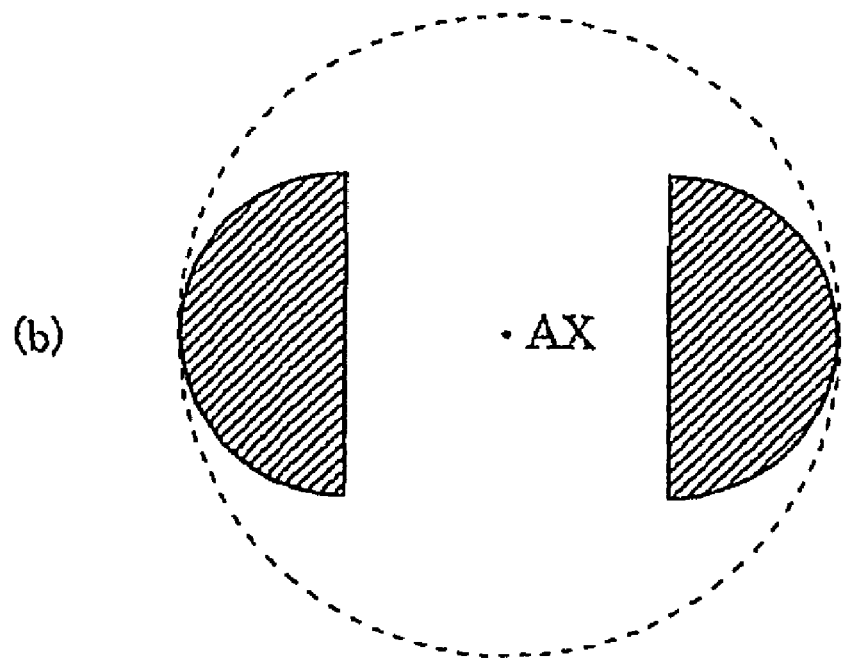

The above description concerned the configuration wherein the annular secondary light source was formed by means of the reflective conical axicon system 25 in the case of the quadrupole illumination as in the case of the annular illumination, but the secondary light source of quadrupole shape can also be formed by means of a reflective pyramid axicon system (not shown) as a quadrupole beam converting unit. A quadrangular pyramid axicon system is comprised, for example, of a first reflecting member having a reflecting surface of a convex quadrangular pyramid shape, and a second reflecting member having a reflecting surface of an annular, quadrangular pyramid shape obtained by cutting a rotationally symmetric region of annular shape away from a concave quadrangular pyramid surface complementary to the reflecting surface of the first reflecting member. In this manner, as shown in FIG. 9(a), an optical intensity distribution (secondary light source) of quadrupole shape is formed on the circular pupil plane (indicated by a dashed line in the drawing) by the action of the quadrangular pyramid axicon system.

As the distance varies between the first reflecting member and the second reflecting member in the quadrangular pyramid axicon system, the outside diameter (inside diameter) of the secondary light source of quadrupole shape varies while keeping the width of the secondary light source of quadrupole shape (half of a difference between a diameter (outside diameter) of a circle circumscribing the secondary light source of quadrupole shape and a diameter (inside diameter) of a circle inscribing the secondary light source) constant. Namely, the annular ratio (inside diameter/outside diameter) and size (outside diameter) of the secondary light source of quadrupole shape varies through action of the quadrangular pyramid axicon system.

Similarly, a secondary light source of a dipole shape can also be formed by means of a reflective V-groove axicon system (not shown) as a dipole beam converting unit. The V-groove axicon system is comprised, for example, of a first reflecting member having a reflecting surface of a convex V-shape, and a second reflecting member having a reflecting surface of an annular V-shape obtained by cutting a rotationally symmetric region of an annular shape away from a concave V-shape complementary to the reflecting surface of the first reflecting member. In this manner, as shown in FIG. 9(b), an optical intensity distribution (secondary light source) of dipole shape is formed on the circular pupil plane (indicated by a dashed line in the drawing) by the action of the V-groove axicon system.

The above description concerned the configuration wherein the aperture stop was located at the position of the secondary light source formed on the illumination pupil. However, without having to be limited to this, the installation of the aperture stop can be omitted depending upon circumstances. This is because the first embodiment permits the wavefront dividing surfaces of the optical integrator OP to be set small and the optical intensity distribution (secondary light source) of almost desired shape is thus formed on the illumination pupil by means of the conical axicon system, rectangular pyramid axicon system, V-groove axicon system, or the like. However, preferably, the aperture stop is located at the position of the secondary light source formed on the illumination pupil, in order to suppress influence of flare. The above first embodiment showed the example in which the aperture stops (24b, 24e) with different aperture diameters to vary the σ-value were set in the illumination optical path, but it is also possible to adopt a configuration wherein a plurality of collimating mirrors 17 with mutually different focal lengths are arranged replaceable, in order to improve the illumination efficiency.

Incidentally, the illumination optical system 2 of the first embodiment is arranged as follows: a multilayer film for reflecting EUV light is provided, for example, on the reflecting surface of the concave reflecting mirror 17, the reflecting surface of each first concave reflector element (first mirror element) 18a in the first fly eye mirror 18, the reflecting surface of each second concave reflector element (second mirror element) 20a in the second fly eye mirror 20, and the reflecting surface of the concave reflecting mirror 19. In general, the incidence angle of EUV light incident to a reflecting surface is desirably kept at about 10°, in order to secure a required reflectance on the reflecting surface consisting of an ordinary multilayer film.

In practical exposure apparatus, however, it is common practice to obtain a required reflection characteristic according to an angle of incidence by increasing the thickness of the multilayer film. By increasing the thickness of the multilayer film little by little, it becomes feasible to secure a required reflectance even for angles of incidence over 10°. For the P-polarization component with respect to the reflecting surface, however, it becomes difficult to secure a sufficient reflectance even by increase of thickness if the angle of incidence exceeds 20°. Therefore, in order to secure the required reflectance in the illumination optical system 2 of the first embodiment, it is important that the incidence angles of light incident to the reflecting surfaces for reflecting EUV light be kept within 20°.

Figure 10:
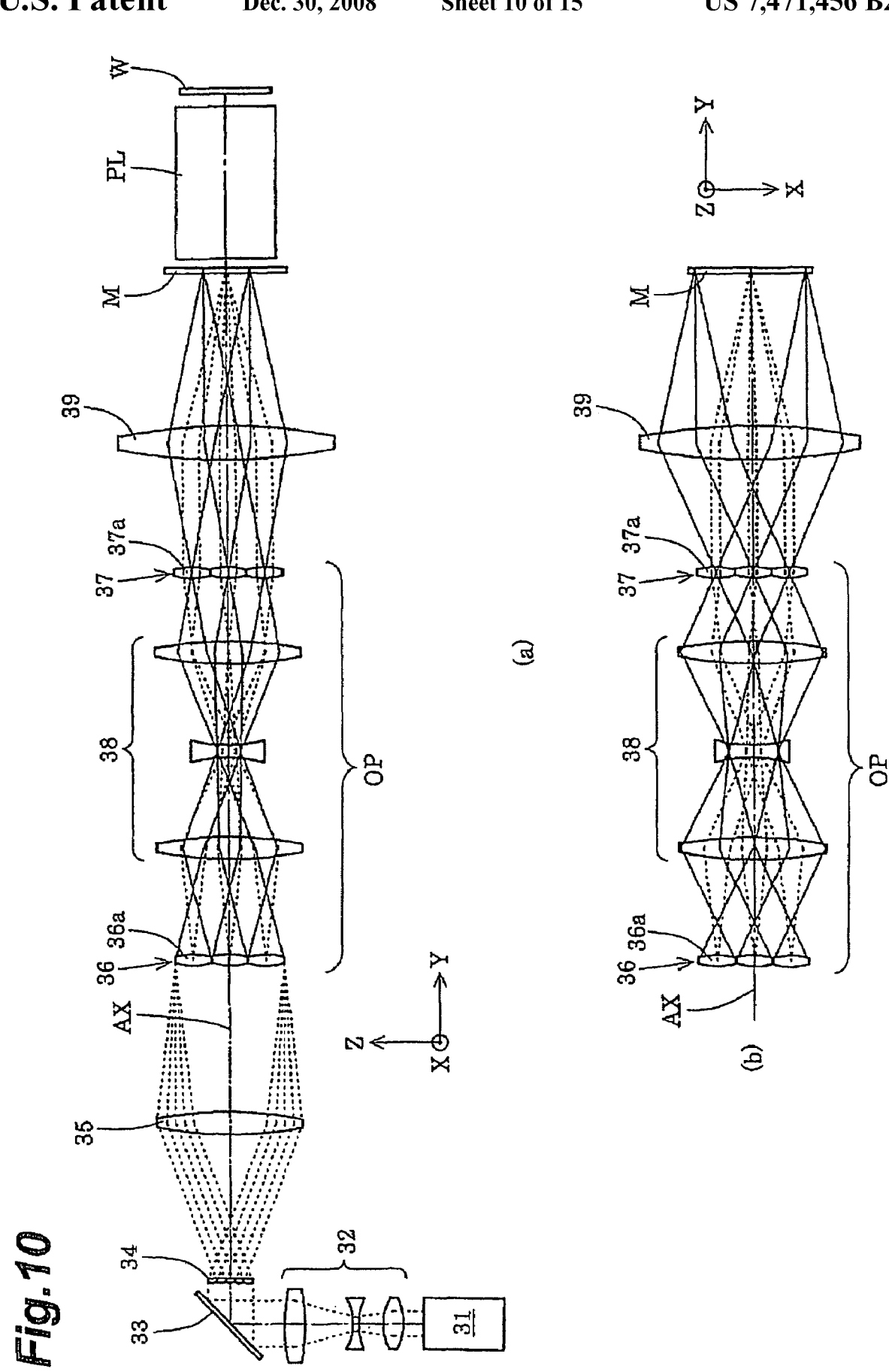
FIG. 10 is a drawing schematically showing a configuration of an exposure apparatus according to a second embodiment.

FIG. 10 is a drawing schematically showing a configuration of an exposure apparatus according to the second embodiment of the present invention. In FIG. 10(a), a Y-axis is set along a direction of the optical axis AX of the projection optical system PL, i.e., along a direction of a normal to the plane of wafer W as a photosensitive substrate, a Z-axis along a direction parallel to the plane of FIG. 10 in the plane of wafer W, and an X-axis along a direction perpendicular to the plane of FIG. 10 in the plane of wafer W. In the second embodiment, the present invention is applied to the exposure apparatus, for example, with an ArF excimer laser light source for supplying light at the wavelength of 193 nm or with a KrF excimer laser light source for supplying light at the wavelength of 248 nm.

Referring to FIG. 10(a), the exposure apparatus of the second embodiment has a light source 31 for supplying exposure light (illumination light). Light emitted from the light source 31 such as the ArF excimer laser light source or the KrF excimer laser light source is guided through a shaping optical system 32 to be expanded into a beam of a required sectional shape, and thereafter the light is reflected by a path bending mirror 33 to enter a fly eye lens 34. The beam incident to the fly eye lens 34 is two-dimensionally divided by a number of lens elements to form a number of light sources on or near the rear focal plane thereof.

Beams from the large number of light sources formed on or near the rear focal plane of the fly eye lens 34 are guided through a relay lens 35 to illuminate an entrance surface of an optical integrator OP in a superimposed manner. The optical integrator OP is composed of a pair of fly eye members 36 and 37, and a relay optical system 38 disposed in the optical path between them, the detailed configuration and action of which will be described later. The beams incident to the optical integrator OP (36-38) form a substantial surface illuminant (secondary light source) of a predetermined shape near the second fly eye member, i.e., near the exit surface of the optical integrator OP.

The substantial surface illuminant is formed at or near the position of the exit pupil of the illumination optical system (32-39), i.e., on or near a plane optically conjugate with the entrance pupil of the projection optical system PL. Light from the substantial surface illuminant is guided through a condenser optical system 39 as a light-guiding optical system to illuminate a mask M with a predetermined pattern in a superimposed manner. A pattern to be transformed is formed in the mask M, and a pattern region of a rectangular shape (slit shape) having longer sides along the X-direction and shorter sides along the Z-direction is illuminated in the entire pattern region. A beam passing through the pattern of mask M travels through the projection optical system PL to form a pattern image of the mask M on a wafer W as a photosensitive substrate.

Figure 11:
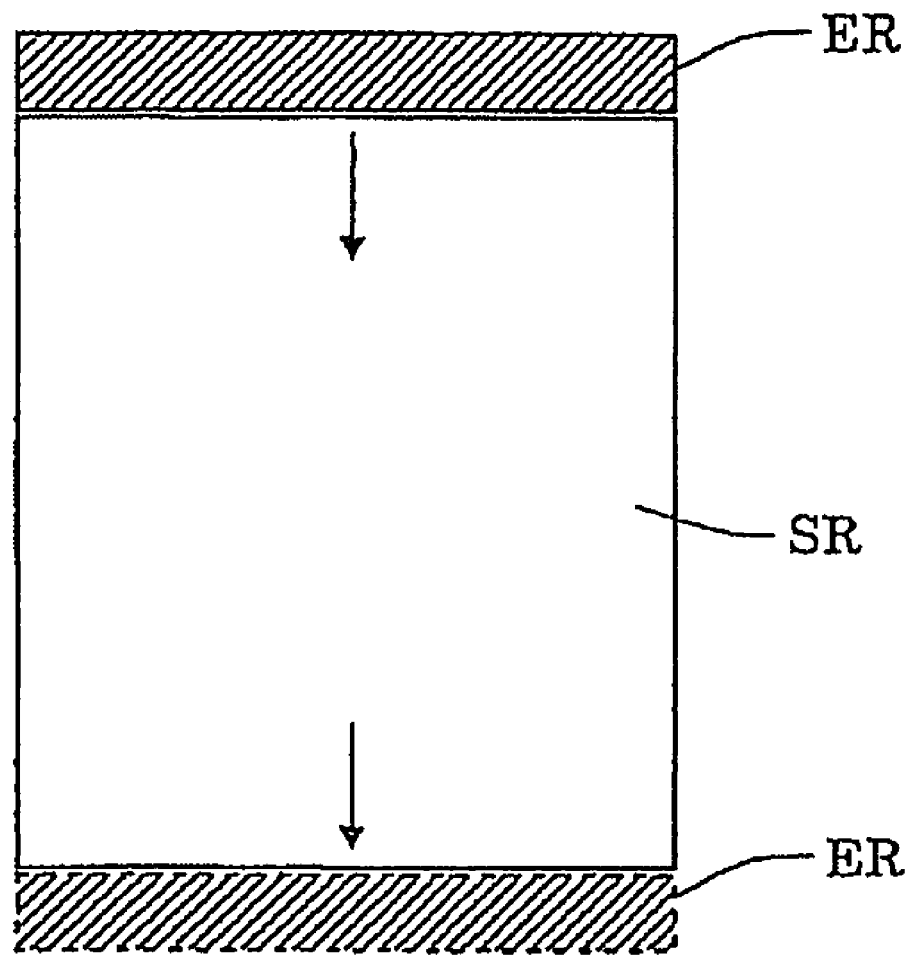
FIG. 11 is a drawing schematically illustrating one scanning exposure process in the second embodiment.

Namely, the pattern image is also formed in a static exposure region (effective exposure region) of a rectangular shape having longer sides along the X-direction and shorter sides along the Z-direction on the wafer W, so as to optically correspond to the illumination region of the rectangular shape on the mask M. In this configuration, the mask M and wafer W are synchronously moved (to scan) along the Z-direction (scanning direction) in the plane (XZ plane) perpendicular to the optical axis AX of the projection optical system PL according to the so-called step-and-scan method, as shown in FIG. 11, whereby the mask pattern is formed by scanning exposure in a shot area (exposure region) SR having a width equal to the X-directional size of the static exposure region ER and a length according to a scanning distance (movement amount) of the wafer W, on the wafer W.

Referring to FIG. 10(a) and (b), the optical integrator OP of the second embodiment is composed of the first fly eye member 36 consisting of a plurality of first positive lens elements (first focusing elements) 36a arranged in parallel, the second fly eye member 37 consisting of a plurality of second positive lens elements (second focusing elements) 37a arranged in parallel so as to correspond to the plurality of first positive lens elements 36a, and the relay optical system 38 disposed in the optical path between the pair of fly eye members 36 and 37. In FIG. 10, for clarification of the drawing, the positive lens (positive single lens) elements 36a, 37a constituting the pair of fly eye members 36, 37 are illustrated by a number much smaller than the actual number.

Figure 12:
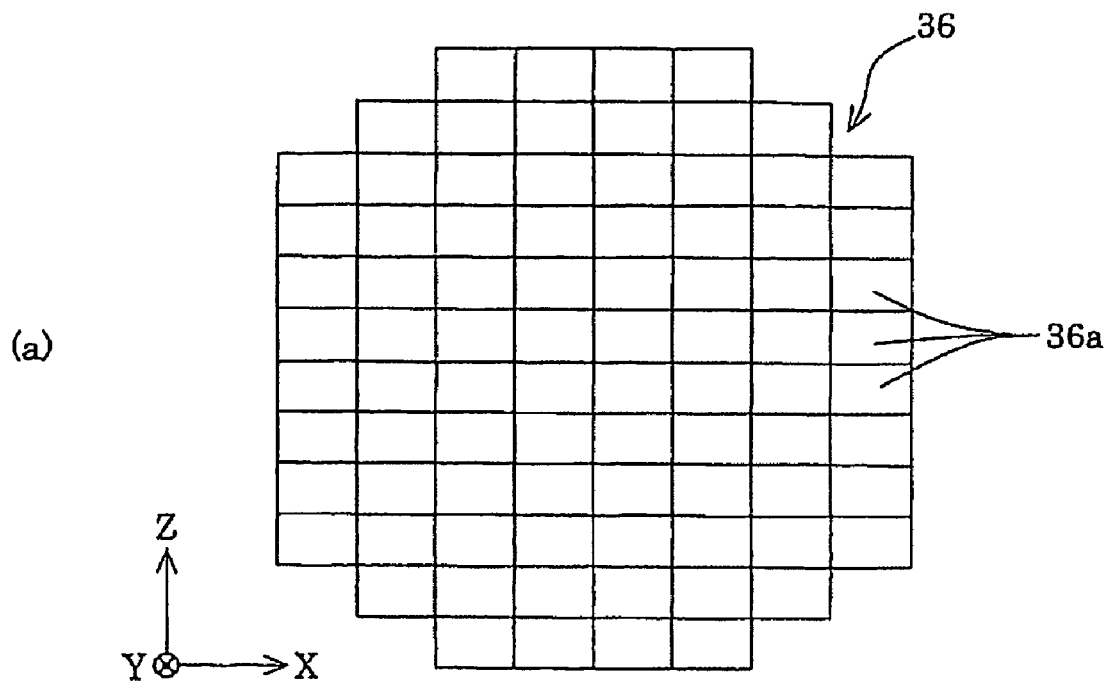
FIG. 12 is a drawing schematically showing configurations of an entrance surface of a first fly eye member forming an optical integrator of FIG. 10 and an entrance surface of a first fly eye member in a conventional example, which are viewed from a traveling direction of light.
Figure 12:
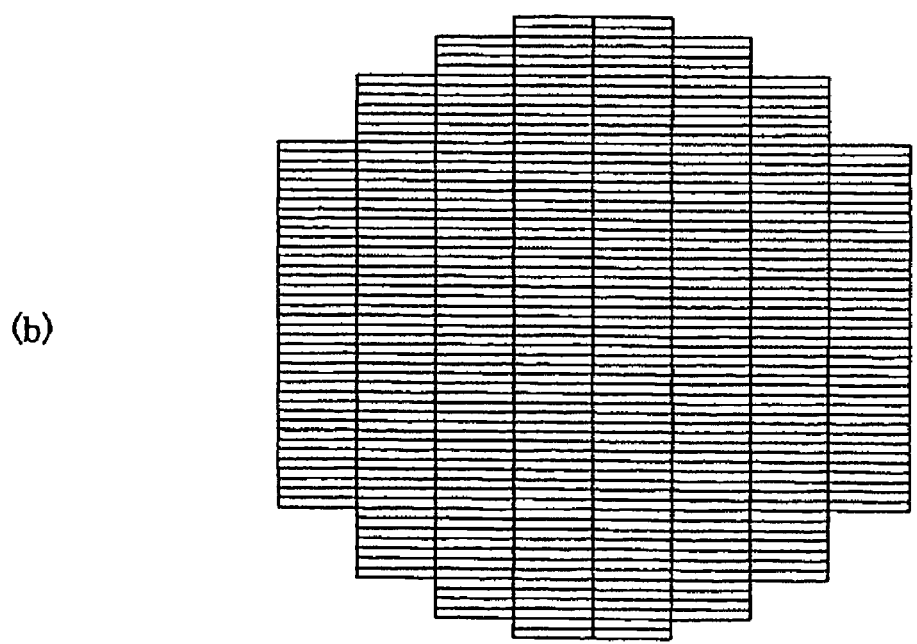

The first fly eye member 36, as shown in FIG. 12(a), is constructed by arranging the first positive lens elements 36a of rectangular outer shape vertically and horizontally and densely. Although not illustrated, the second fly eye member 37 is also constructed by arranging the second positive lens elements 37a of rectangular outer shape vertically and horizontally and densely, according to a pattern of parallel arrangement similar to that of the first fly eye member 36. Since the sectional shape of the beam incident to the optical integrator OP is nearly circular, the contour shape of the first fly eye member 36, when viewed from the traveling direction of light, is of a shape close to a circular shape in order to enhance the illumination efficiency (cf. FIG. 12(a)). FIG. 10 showed the example in which the relay optical system 38 was composed of three, positive, negative, and positive lenses, but the relay optical system 38 can also be constructed of a positive single lens. Furthermore, the relay optical system can also be constructed of a plurality of lens units, e.g., positive, negative, and positive lens units.

In the second embodiment, each of the first positive lens elements 36a, the second positive lens elements 37a, and the relay optical system 38 is constructed as a toric lens. Namely, in the first positive lens elements 36a and the second positive lens elements 37a, the focal length about the YZ plane is different from the focal length about the XY plane. The relay optical system 38 has mutually different focal lengths on the YZ plane and on the XY plane, and thus has mutually different object-image distances in these two directions.

In the optical integrator OP of the second embodiment, when the parallel beam is incident to the first fly eye member 36, the incident beam is subject to wavefront dividing by the individual first positive lens elements 36a, as indicated by solid lines in FIG. 10. Then a beam through each first positive lens element 36a is focused once and thereafter travels through the relay optical system 38 to be focused at a point on or near a corresponding second positive lens element 37a. In this manner, a substantial surface illuminant is formed on or near the exit surface of the optical integrator OP.

However, since each first positive lens element 36a is constructed as a toric lens as described above, a position where a beam through a first positive lens element 36a is focused at a point in the YZ plane is different from a position where the beam is focused at a point in the XZ plane. Beams each focused at a point on or near each second positive lens element 37a, i.e., beams from respective light sources constituting the substantial surface illuminant are guided through the condenser optical system 39 to illuminate the rectangular illumination region on the mask M as a surface to be illuminated, in a superimposed manner.

In this manner, the relay optical system 38 refocuses a beam focused via one of the first positive lens elements 36a, on or near a corresponding second positive lens element 37a so as to establish an imaging relation of one-to-one correspondence between one of the first positive lens elements 36a forming the first fly eye member 36 and one of the second positive lens elements 37a forming the second fly eye member 37. On the other hand, rays diverging from a point on each first positive lens element 36a are guided through the relay optical system 38 to be focused once, as indicated by dashed lines in FIG. 10, and thereafter are incident to each corresponding second positive lens element 37a.

Since the relay optical system 38 is also constructed as a toric lens (toric optical system) as described above, a position where the beam through the relay optical system 38 is focused at a point in the YZ plane is different from a position where the beam is focused at a point in the XY plane. The beams passing through the respective second positive lens elements 37a are guided through the condenser optical system 39 to be focused at a point in the rectangular illumination region on the mask M. In the optical integrator OP of the second embodiment, as described above, each of all the first positive lens elements 36a forming the first fly eye member 36 is arranged so as to be conjugate with the pattern surface of the mask M. The reason why the first positive lens elements 36a forming the first fly eye member 36 have the rectangular outer shape is that the rectangular illumination region can efficiently be illuminated on the mask M.

In the optical integrator OP of the second embodiment, as described above, the relay optical system 38 is disposed in the optical path between the first fly eye member 36 and the second fly eye member 37. The relay optical system 38 refocuses a light beam focused via one of the first positive lens elements 36a, on or near a corresponding second positive lens element 37a so as to establish an imaging relation of one-to-one correspondence between one of the first positive lens elements 36a forming the first fly eye member 36 and one of the second positive lens elements 37a forming the second fly eye member 37. As a result, the second embodiment also permits the distance between the first fly eye member 36 and the second fly eye member 37 to be relatively freely set independent of the focal length of the first fly eye member 36.

In the second embodiment, as described above, all the first positive lens elements 36a forming the first fly eye member 36 are set each to be conjugate with the pattern surface of the mask M (and with the exposure surface of the wafer W eventually). Therefore, in order to enhance the illumination efficiency according to the conventional technology, the first positive lens elements 36a are required to have an oblong rectangular outer shape similar to the outer shape of the illumination region of the mask M (and the static exposure region ER of the wafer W eventually) (cf. FIG. 11). On the other hand, since the sectional shape of the beam incident to the optical integrator OP is nearly circular as described above, the contour of the first fly eye member 36, when viewed from the traveling direction of light, needs to be a shape close to the circular shape (cf. FIG. 12(a)) in order to enhance the illumination efficiency.

In the first fly eye member 36, the first positive lens elements 36a need to be arranged in parallel by an enough number both in the horizontal direction and in the vertical direction, in order to achieve the required wavefront dividing effect. For this reason, if the outer shape of the first positive lens elements 36a is set to an oblong rectangular shape similar to the outer shape of the static exposure region ER of the wafer W as in the conventional technology, the number of first positive lens elements arranged in the transverse direction of the outer shape will be too large (cf. FIG. 12(b)), which will adversely affect the production cost of the first fly eye member 36 and, in turn, the production cost of the optical integrator OP.

In the second embodiment, since each of the first positive lens elements 36a, the second positive lens elements 37a, and the relay optical system 38 is constructed as a toric lens as described above, the outer shape of the first positive lens elements 36a can be set to a rectangular shape close to a square in an aspect ratio different from that of the outer shape of the static exposure region ER in the wafer W. As a result, in the first fly eye member 36 of the second embodiment, as shown in FIG. 12(a), the number of first positive lens elements 36a arranged along the transverse direction of the rectangular outer shape (the vertical direction in the drawing) is not too large, which can keep down the production cost of the first fly eye member 36 and, in turn, the production cost of the optical integrator OP.

The above-described second embodiment adopted the scanning exposure of the mask pattern in each shot area SR performed by synchronously moving the mask M and the wafer W relative to the projection optical system PL according to the step-and-scan method. However, without having to be limited to this, it is also possible to adopt a method of repeating full-field exposure of the mask pattern in each shot area of the wafer W while keeping the mask M and wafer W still relative to the projection optical system PL in accordance with the step-and-repeat method.

In the second embodiment, the condenser optical system 39 focuses the light from the secondary light source (the substantial surface illuminant formed near the exit surface of the optical integrator OP) to illuminate the mask M in a superimposed manner. However, without having to be limited to this, it is also possible to adopt a configuration in which an illumination field stop (mask blind) and an imaging optical system for forming an image of the illumination field stop on the mask M are located in the optical path between the condenser optical system 39 and the mask M. In this case, the condenser optical system 39 focuses the light from the secondary light source to illuminate the illumination field stop in a superimposed manner, and the imaging optical system forms an image of an aperture portion (light transmitting portion) of the illumination field stop on the mask M.

The exposure apparatus according to the above-described embodiments can be used to produce micro devices (semiconductor devices, image pickup devices, liquid-crystal display devices, thin-film magnetic heads, etc.) by illuminating a mask (reticle) by the illumination optical apparatus (illumination step) and exposing a photosensitive substrate to a pattern for printing formed on the mask, by the projection optical system (exposure step). An example of a method of fabricating semiconductor devices as micro devices by forming a predetermined circuit pattern on a wafer or the like as a photosensitive substrate with the use of the exposure apparatus of the above embodiment will be described below with reference to the flowchart of FIG. 13.

Figure 13:
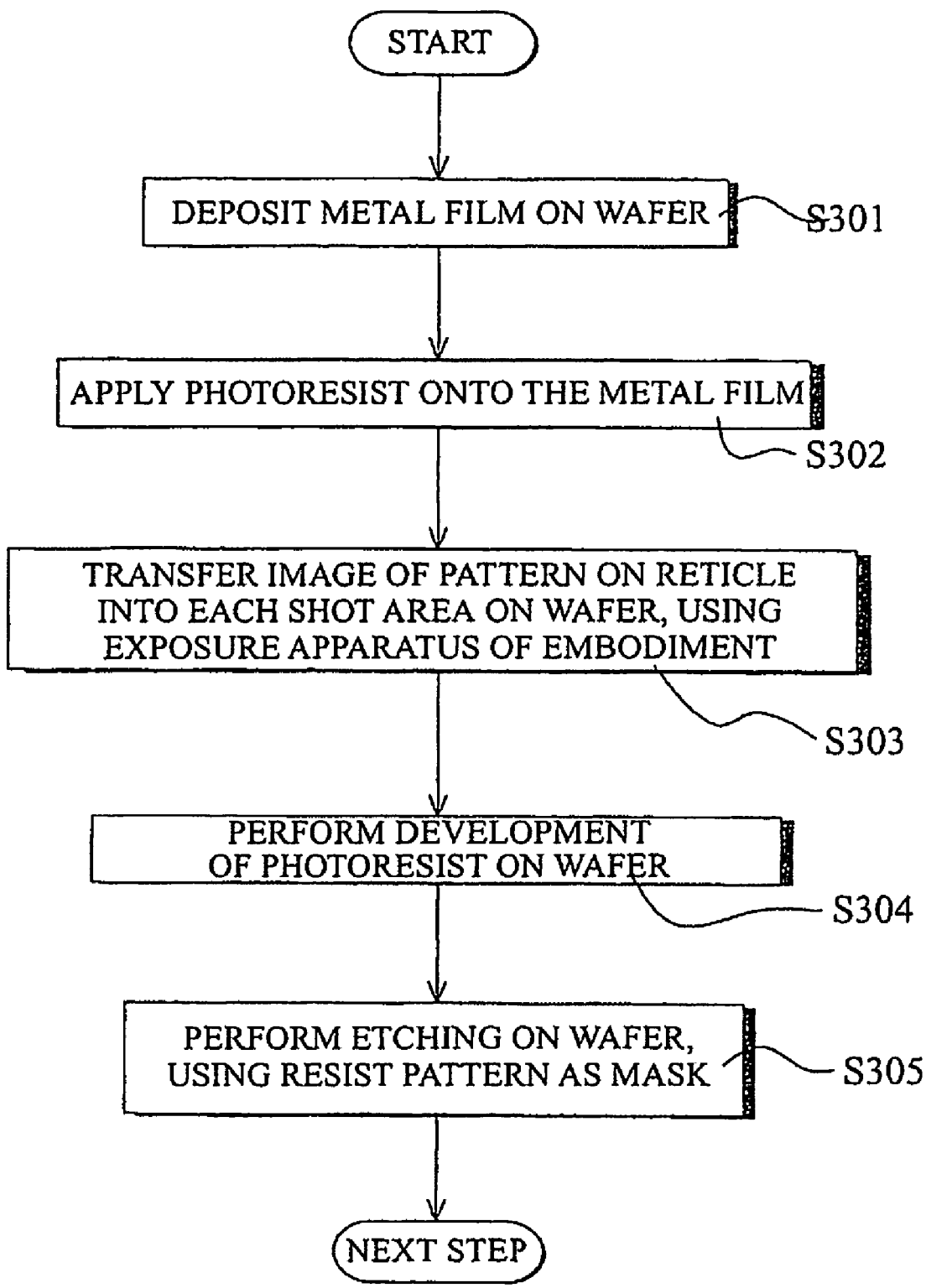
FIG. 13 is a flowchart of a method of fabricating semiconductor devices as micro devices.

The first step 301 in FIG. 13 is to deposit a metal film on each of wafers in one lot. The next step 302 is to apply a photoresist onto the metal film on each wafer in the lot. The subsequent step 303 is to project and print an image of a pattern on a mask into each shot area on each wafer in the lot through the projection optical system, using the exposure apparatus of the above embodiments. The next step 304 is to perform development of the photoresist on each wafer in the lot, and the subsequent step 305 is to perform etching with the resist pattern as a mask on each wafer in the lot to form a circuit pattern corresponding to the pattern on the mask, in each shot area on each wafer. Thereafter, circuit patterns of upper layers are further formed and other steps are carried out to fabricate devices such as semiconductor devices. The above-described semiconductor device fabrication method permits us to obtain semiconductor devices with extremely fine circuit patterns at high throughput.

Figure 14:
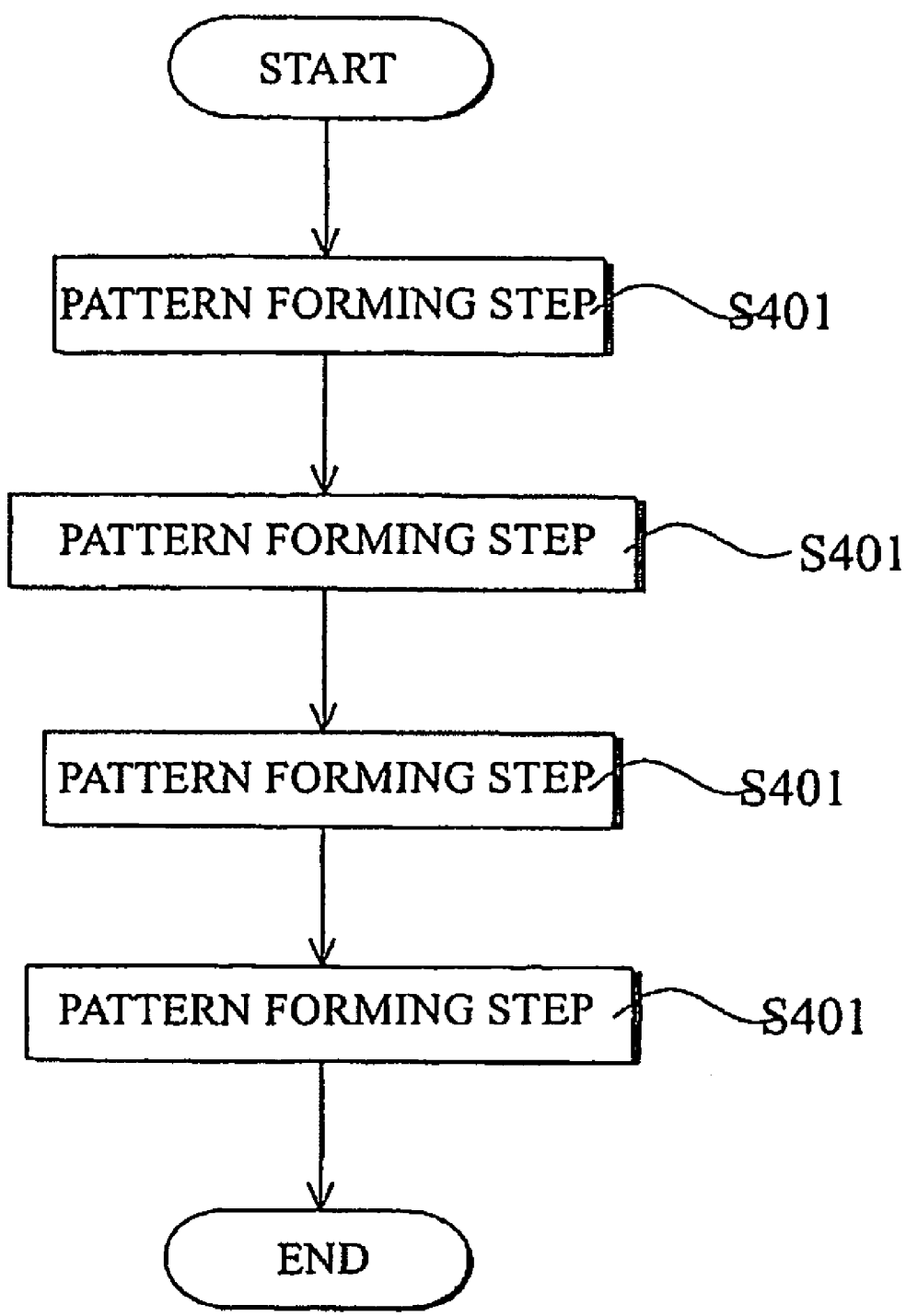
FIG. 14 is a flowchart of a method of fabricating a liquid-crystal display device as a micro device.
Figure 15:
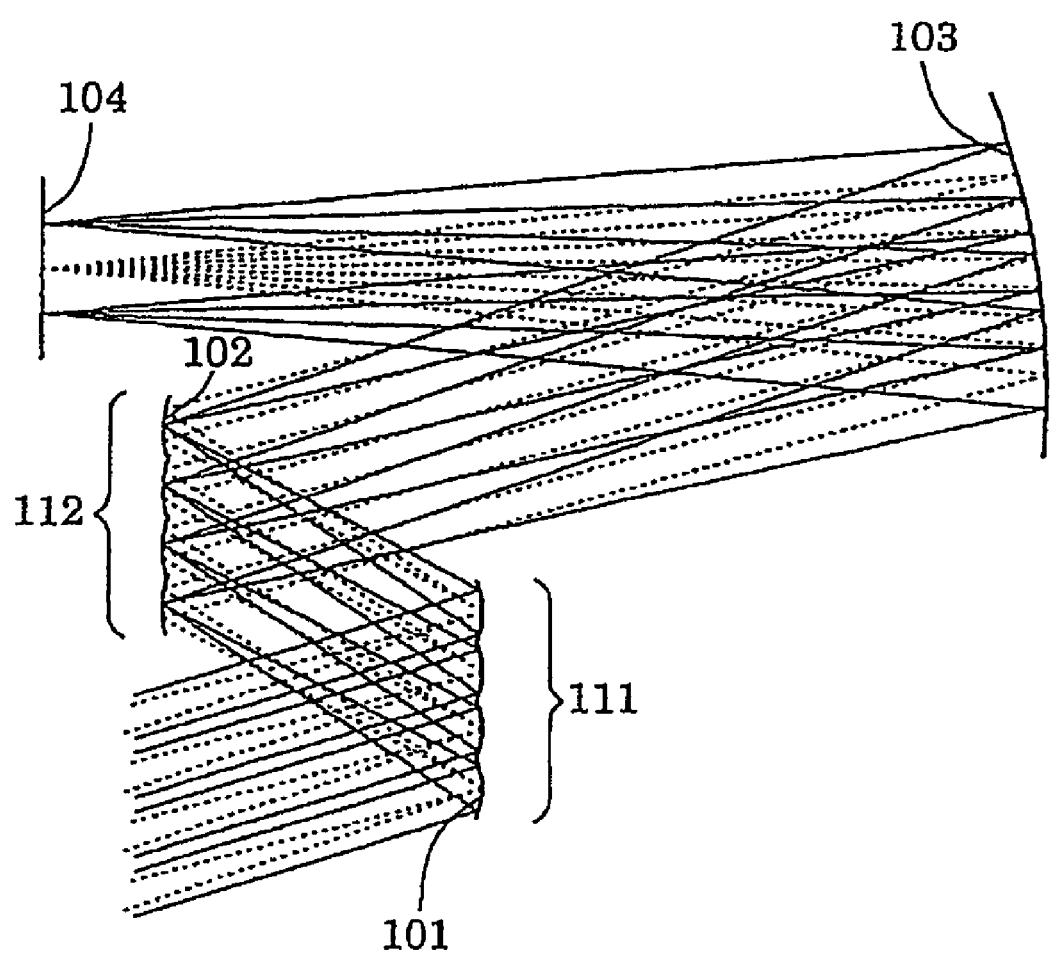
FIG. 15 is a drawing illustrating the inconveniences in the conventional reflective optical integrator disclosed in Patent Document 1.

The exposure apparatus of the above embodiments can also be used to obtain a liquid-crystal display device as a micro device by forming predetermined patterns (circuit pattern, electrode pattern, etc.) on plates (glass substrates). An example of a method for this fabrication will be described below with reference to the flowchart of FIG. 14. In FIG. 14, a pattern forming step 401 is to execute a so-called photolithography step of transferring and printing a pattern of a mask onto a photosensitive substrate (a glass substrate coated with a resist, or the like) with the use of the exposure apparatus of the above embodiments. This photolithography step results in forming the predetermined pattern including a number of electrodes and others on the photosensitive substrate. Thereafter, the exposed substrate is subjected to steps such as a development step, an etching step, and a resist removing step, whereby the predetermined pattern is formed on the substrate, followed by the next color filter forming step 402.

The next color filter forming step 402 is to form a color filter in which a number of sets of three dots corresponding to R (Red), G (Green), and B (Blue) are arrayed in a matrix or in which a plurality of sets of three stripes of R, G, and B are arrayed in a direction of horizontal scan lines. After the color filter forming step 402, a cell assembling step 403 is carried out. The cell assembling step 403 is to assemble a liquid crystal panel (liquid crystal cell), using the substrate with the predetermined pattern obtained by the pattern forming step 401, the color filter obtained by the color filter forming step 402, and so on.

In the cell assembling step 403, for example, a liquid crystal is poured into between the substrate with the predetermined pattern obtained by the pattern forming step 401 and the color filter obtained by the color filter forming step 402, to fabricate the liquid crystal panel (liquid crystal cell). The subsequent module assembling step 404 is to mount such components as an electric circuit and a backlight for implementing a display operation of the assembled liquid crystal panel (liquid crystal cell), to complete a liquid-crystal display device. The method of fabricating the liquid-crystal display device as described above permits us to obtain the liquid-crystal display devices with extremely fine circuit patterns at high throughput.

The foregoing embodiments showed the examples in which the present invention was applied to the optical integrators for uniformizing the illumination light for illuminating the surface to be illuminated in the illumination optical apparatus, but, without having to be limited to this, the present invention can also be applied to the general optical integrators of the wavefront dividing type. The foregoing embodiments were the examples in which the present invention was applied to the illumination optical apparatus for illuminating the mask in the exposure apparatus, but, without having to be limited to this, the present invention can also be applied to the general illumination optical apparatus for illuminating a surface to be illuminated, except for masks.

The invention claimed is:

1. An optical integrator of a wavefront dividing type comprising:
    a plurality of first focusing elements two-dimensionally arranged;
    a plurality of second focusing elements two-dimensionally arranged so as to correspond to the plurality of first focusing elements; and
    a relay optical system disposed in an optical path between the plurality of first focusing elements and the plurality of second focusing elements,
    wherein the relay optical system focuses a light beam reflected or transmitted by each one of the first focusing elements, on or near a corresponding one of the second focusing elements so as to establish a one-to-one correspondence between each one of the first focusing elements and a corresponding one of the second focusing elements.

2. An optical integrator according to claim 1, wherein at least either the first focusing elements or the second focusing elements have focal lengths different from each other in two mutually orthogonal directions.

3. An optical integrator according to claim 1, wherein the relay optical system has object-image distances different from each other in two mutually different directions.

4. An optical integrator according to claim 1, wherein the relay optical system has focal lengths different from each other in two mutually different directions.

5. An optical integrator according to claim 1, wherein an outer shape of an optical surface of each of the first focusing elements is different from an outer shape of an optical surface of each of the second focusing elements.

6. An optical integrator according to claim 1, wherein each of the first focusing elements is a positive single lens and each of the second focusing elements is a positive single lens.

7. An optical integrator according to claim 1, wherein each of the first focusing elements is a concave reflecting mirror and each of the second focusing elements is a concave reflecting mirror.

8. An optical integrator according to claim 7, wherein the relay optical system is a concave reflecting mirror.

9. An optical integrator according to claim 8, wherein angles of incidence of light to the first focusing elements, to the second focusing elements, and to the relay optical system are within 20°.

10. An optical integrator according to claim 1, wherein the relay optical system is a positive single lens or a concave reflecting mirror.

11. An optical integrator according to claim 1, wherein each of the first focusing elements has an arcuate outer shape.

12. An optical integrator according to claim 1, wherein each of the first focusing elements has a rectangular outer shape.

13. An optical integrator according to claim 1, wherein the first focusing elements and the second focusing elements are arranged in parallel.

14. An optical integrator according to claim 13, wherein a pattern of parallel arrangement of the first focusing elements is different from a pattern of parallel arrangement of the second focusing elements.

15. An optical integrator according to claim 1, wherein the relay optical system refocuses a light beam focused after being reflected or transmitted by one of the first focusing elements, on or near the corresponding one of the second focusing elements.

16. An illumination optical apparatus for illuminating a surface to be illuminated, based on light from a light source,
the illumination optical apparatus comprising the optical integrator as defined in claim 1, which is disposed in an optical path between the light source and the surface to be illuminated.

17. An illumination optical apparatus according to claim 16, further comprising a varying device for varying at least one of a size and a shape of a secondary light source formed by the optical integrator.

18. An illumination optical apparatus according to claim 16, wherein the first focusing elements of the optical integrator and the surface to be illuminated are arranged so as to be approximately optically conjugate with each other.

19. An illumination optical apparatus according to claim 16, further comprising light-guiding optical system disposed in an optical path between the optical integrator and the surface to be illuminated, and adapted for guiding light beams from the respective second focusing elements in a superposed manner to the surface to be illuminated.

20. An exposure apparatus comprising the illumination optical apparatus as defined in claim 16, and adapted for performing exposure of a photosensitive substrate with a pattern of a mask placed on the surface to be illuminated.

21. An exposure apparatus according to claim 20, further comprising a projection optical system for forming an image of the pattern of the mask on the photosensitive substrate, wherein the mask and the photosensitive substrate are moved relative to the projection optical system, to project the pattern of the mask onto the photosensitive substrate for exposure.

22. A method of fabricating a device, comprising:
an exposure step of performing exposure of the photosensitive substrate with the predetermined pattern, using the exposure apparatus as defined in claim 20; and
a development step of developing the photosensitive substrate having passed through the exposure step.

23. An exposure method of illuminating a mask placed on the surface to be illuminated, via the illumination optical apparatus as defined in claim 16, for exposure of a photosensitive substrate with a pattern of the mask.

24. An exposure method according to claim 23, wherein the mask and the photosensitive substrate are moved relative to a projection optical system for forming an image of the pattern of the mask on the photosensitive substrate, to project the pattern of the mask onto the photosensitive substrate for exposure.

25. An optical integrator of a wavefront dividing type comprising:
a plurality of first mirror elements two-dimensionally arranged;
a plurality of second mirror elements two-dimensionally arranged so as to correspond to the plurality of first mirror elements; and
a relay mirror disposed in an optical path between the plurality of first mirror elements and the plurality of second mirror elements,
wherein the relay mirror focuses a light beam reflected by each one of the first mirror elements, on or near a corresponding one of the second mirror elements so as to establish a one-to-one correspondence between each one of the first mirror elements and a corresponding one of the second mirror elements.

26. An optical integrator according to claim 25, wherein a center of curvature of a reflecting surface of the relay mirror is present between the first mirror elements and the relay mirror or between the second mirror elements and the relay mirror.

27. An optical integrator according to claim 25, wherein angles of incidence of light to the first mirror elements, to the second mirror elements, and to the relay mirror are within 20°.

28. An optical integrator according to claim 25, wherein the relay mirror refocuses a light beam focused after being reflected by one of the first mirror elements, on or near the corresponding one of the second mirror elements.

29. An optical integrator according to claim 25, wherein the first and second mirror elements are arranged in parallel.

30. An illumination optical apparatus for illuminating a surface to be illuminated, based on light from a light source,
the illumination optical apparatus comprising the optical integrator as defined in claim 25, which is disposed in an optical path between the light source and the surface to be illuminated.

31. An illumination optical apparatus according to claim 30, further comprising a varying device for varying at least one of a size and a shape of a secondary light source formed by the optical integrator.

32. An illumination optical apparatus according to claim 30, wherein the first focusing elements of the optical integrator and the surface to be illuminated are arranged so as to be approximately optically conjugate with each other.

33. An illumination optical apparatus according to claim 30, further comprising a light-guiding optical system disposed in an optical path between the optical integrator and the surface to be illuminated, and adapted for guiding light beams from the respective second mirror elements in a superposed manner to the surface to be illuminated.

34. An exposure apparatus comprising the illumination optical apparatus as defined in claim 30, and adapted for performing the exposure of a photosensitive substrate with a pattern of a mask placed on the surface to be illuminated.

35. An exposure apparatus according to claim 34, further comprising a projection optical system for forming an image of the pattern of the mask on the photosensitive substrate, wherein the mask and the photosensitive substrate are moved relative to the projection optical system, to project the pattern of the mask onto the photosensitive substrate for exposure.

36. A method of fabricating a device, comprising:
an exposure step of performing exposure of the photosensitive substrate with the predetermined pattern, using the exposure apparatus as defined in claim 34; and
a development step of developing the photosensitive substrate having passed through the exposure step.

37. An exposure method of illuminating a mask placed on the surface to be illuminated, via the illumination optical apparatus as defined in claim 30, for exposure of a photosensitive substrate with a pattern of the mask.

38. An exposure method according to claim 37, wherein the mask and the photosensitive substrate are moved relative to a projection optical system for forming an image of the pattern of the mask on the photosensitive substrate, to project the pattern of the mask onto the photosensitive substrate for exposure.

39. An optical integrator of a wavefront dividing type comprising:
a plurality of first mirror elements two-dimensionally arranged;
a plurality of second mirror elements two-dimensionally arranged so as to correspond to the plurality of first mirror elements; and
a relay mirror disposed in an optical path between the plurality of first mirror elements and the plurality of second mirror elements,
wherein angles of incidence of light to the first mirror elements, to the second mirror elements, and to the relay mirror are within 20°.

40. An illumination optical apparatus for illuminating a surface to be illuminated, based on light from a light source,
the illumination optical apparatus comprising the optical integrator as defined in claim 39, which is disposed in an optical path between the light source and the surface to be illuminated.

41. An illumination optical apparatus according to claim 40, further comprising a varying device for varying at least one of a size and a shape of a secondary light source formed by the optical integrator.

42. An illumination optical apparatus according to claim 40, wherein the first mirror elements of the optical integrator and the surface to be illuminated are arranged so as to be approximately optically conjugate with each other.

43. An illumination optical apparatus according to claim 40, further comprising a light-guiding optical system disposed in an optical path between the optical integrator and the surface to be illuminated, and adapted for guiding light beams from the respective second mirror elements in a superposed manner to the surface to be illuminated.

44. An exposure apparatus comprising the illumination optical apparatus as defined in claim 40, and adapted for performing exposure of a photosensitive substrate with a pattern of a mask placed on the surface to be illuminated.

45. An exposure apparatus according to claim 44, further comprising a projection optical system for forming an image of the pattern of the mask on the photosensitive substrate, wherein the mask and the photosensitive substrate are moved relative to the projection optical system, to project the pattern of the mask onto the photosensitive substrate for exposure.

46. A method of fabricating a device, comprising:
an exposure step of performing exposure of the photosensitive substrate with the predetermined pattern, using the exposure apparatus as defined in claim 44; and
a development step of developing the photosensitive substrate having passed through the exposure step.

47. An exposure method of illuminating a mask placed on the surface to be illuminated, via the illumination optical apparatus as defined in claim 40, for exposure of a photosensitive substrate with a pattern of the mask.

48. An exposure method according to claim 40, wherein the mask and the photosensitive substrate are moved relative to a projection optical system for forming an image of the pattern of the mask on the photosensitive substrate, to project the pattern of the mask onto the photosensitive substrate for exposure.

* * * * *